(12) United States Patent
Liu et al.

(10) Patent No.: US 11,678,491 B2
(45) Date of Patent: *Jun. 13, 2023

(54) EMBEDDED MEMORY USING SOI STRUCTURES AND METHODS

(71) Applicant: Taiwan Semiconductor Manufacturing Company, Ltd., Hsin-Chu (TW)

(72) Inventors: Chien Hung Liu, Hsinchu County (TW); Chih-Wei Hung, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/336,780

(22) Filed: Jun. 2, 2021

(65) Prior Publication Data

US 2021/0288059 A1    Sep. 16, 2021

Related U.S. Application Data

(60) Continuation of application No. 16/560,055, filed on Sep. 4, 2019, now Pat. No. 11,037,949, which is a
(Continued)

(51) Int. Cl.
*H10B 43/30* (2023.01)
*H01L 27/11568* (2017.01)
(Continued)

(52) U.S. Cl.
CPC ........ *H01L 27/11568* (2013.01); *G11C 16/08* (2013.01); *G11C 16/22* (2013.01);
(Continued)

(58) Field of Classification Search
CPC ......... H01L 27/11568; H01L 21/26513; H01L 21/324; H01L 21/84; H01L 27/11573;
(Continued)

(56) References Cited

U.S. PATENT DOCUMENTS 6,914,290 B2   7/2005   Yoo et al.
7,754,556 B2   7/2010   Feudel et al.
(Continued)

FOREIGN PATENT DOCUMENTS

DE   102016123406 A1   6/2017
TW      201732823 A    9/2017

OTHER PUBLICATIONS

Non-Final Office Action dated Jan. 3, 2020 in connection with U.S. Appl. No. 16/015,446.
(Continued)

*Primary Examiner* — Syed I Gheyas
(74) *Attorney, Agent, or Firm* — Eschweiler & Potashnik, LLC

(57) ABSTRACT

An integrated circuit (IC) includes a semiconductor-on-insulator (SOI) substrate comprising a handle substrate, an insulator layer over the handle substrate, and a semiconductor device layer over the insulator layer. A logic device includes a logic gate arranged over the semiconductor device layer. The logic gate is arranged within a high κ dielectric layer. A memory cell includes a control gate and a select gate laterally adjacent to one another and arranged over the semiconductor device layer. A charge-trapping layer underlies the control gate.

20 Claims, 16 Drawing Sheets

Related U.S. Application Data division of application No. 16/015,446, filed on Jun. 22, 2018, now Pat. No. 10,879,256.

(60) Provisional application No. 62/589,801, filed on Nov. 22, 2017.

(51) Int. Cl.

| | |
|---|---|
| *G11C 16/24* | (2006.01) |
| *H01L 27/11573* | (2017.01) |
| *H01L 29/08* | (2006.01) |
| *H01L 29/06* | (2006.01) |
| *H01L 29/66* | (2006.01) |
| *H01L 21/84* | (2006.01) |
| *H01L 21/3213* | (2006.01) |
| *H01L 21/321* | (2006.01) |
| *H01L 21/265* | (2006.01) |
| *H01L 21/02* | (2006.01) |
| *H01L 21/324* | (2006.01) |
| *H01L 21/762* | (2006.01) |
| *G11C 16/08* | (2006.01) |
| *G11C 16/22* | (2006.01) |
| *H01L 29/792* | (2006.01) |
| *H01L 27/12* | (2006.01) |
| *H01L 21/28* | (2006.01) |
| *H01L 29/423* | (2006.01) |
| *H01L 29/51* | (2006.01) |
| *G11C 16/04* | (2006.01) |

(52) U.S. Cl.
CPC ........ *G11C 16/24* (2013.01); *H01L 21/02636* (2013.01); *H01L 21/26513* (2013.01); *H01L 21/324* (2013.01); *H01L 21/3212* (2013.01); *H01L 21/32133* (2013.01); *H01L 21/76283* (2013.01); *H01L 21/84* (2013.01); *H01L 27/11573* (2013.01); *H01L 27/1203* (2013.01); *H01L 29/0649* (2013.01); *H01L 29/0847* (2013.01); *H01L 29/40117* (2019.08); *H01L 29/42328* (2013.01); *H01L 29/42364* (2013.01); *H01L 29/513* (2013.01); *H01L 29/517* (2013.01); *H01L 29/6659* (2013.01); *H01L 29/66545* (2013.01); *H01L 29/66833* (2013.01); *H01L 29/792* (2013.01); *G11C 16/0466* (2013.01); *H01L 29/665* (2013.01)

(58) Field of Classification Search
CPC ............. H01L 27/1203; H01L 29/0649; H01L 29/0847; H01L 29/66545
See application file for complete search history.

(56) References Cited

U.S. PATENT DOCUMENTS

| | | |
|---|---|---|
| 7,986,000 B2 | 7/2011 | Mizukami et al. |
| 8,497,529 B2 | 7/2013 | Anderson |
| 9,590,118 B1 | 3/2017 | Smith |
| 9,759,546 B2 | 9/2017 | Kononchuk et al. |
| 9,837,424 B2 | 12/2017 | Yamamoto |
| 2002/0175378 A1 | 11/2002 | Choe |
| 2005/0242391 A1 | 11/2005 | She |
| 2006/0279991 A1 | 12/2006 | Park et al. |
| 2013/0214346 A1 | 8/2013 | Hall et al. |
| 2013/0250700 A1 | 9/2013 | La Rosa |
| 2014/0183618 A1 | 7/2014 | Hee |
| 2014/0225176 A1 | 8/2014 | Cheek |
| 2014/0374814 A1 | 12/2014 | Wu |
| 2015/0287738 A1 | 10/2015 | Kuo et al. |
| 2016/0181265 A1 | 6/2016 | Regnier et al. |
| 2016/0190249 A1 | 6/2016 | Hsieh et al. |
| 2017/0033135 A1 | 2/2017 | Whitefield et al. |
| 2017/0194334 A1 | 7/2017 | Wu et al. |
| 2019/0057970 A1 | 2/2019 | Sun et al. |

OTHER PUBLICATIONS

Final Office Action dated Jun. 18, 2020 in connection with U.S. Appl. No. 16/015,446.

Notice of Allowance dated Aug. 27, 2020 in connection with U.S. Appl. No. 16/015,446.

Non-Final Office Action dated Oct. 27, 2020 in connection with U.S. Appl. No. 16/560,055.

Notice of Allowance dated Feb. 9, 2021 in connection with U.S. Appl. No. 16/560,055.

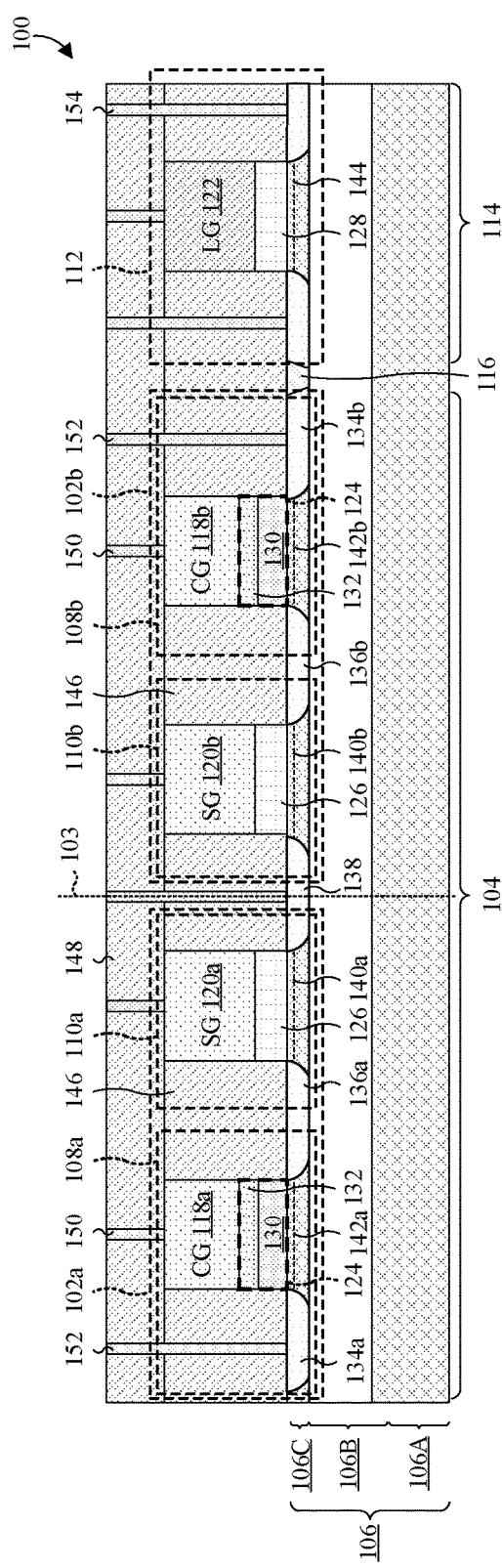
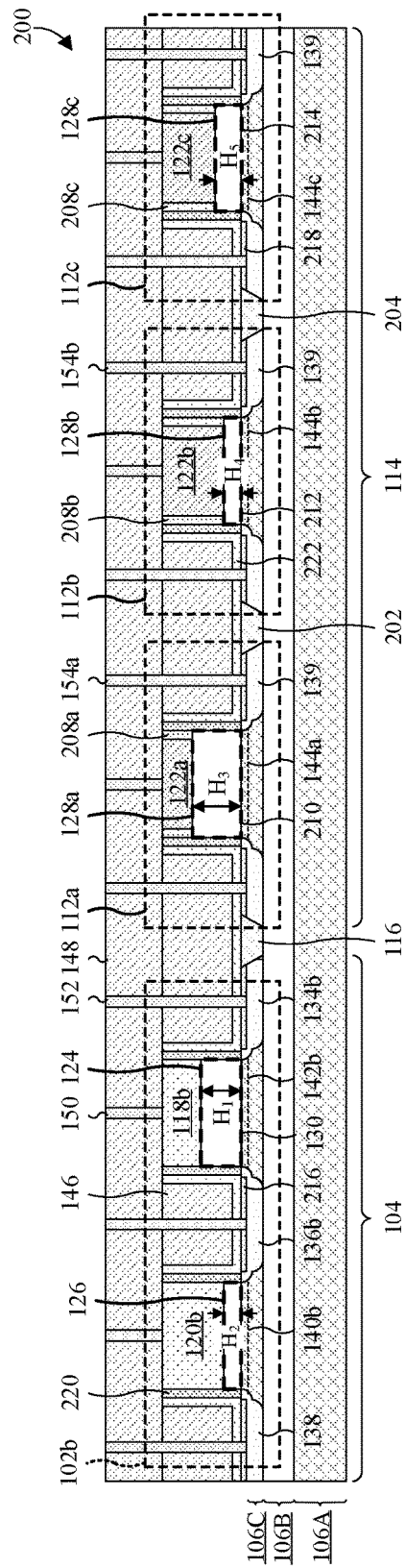
Fig. 1A
Fig. 1B

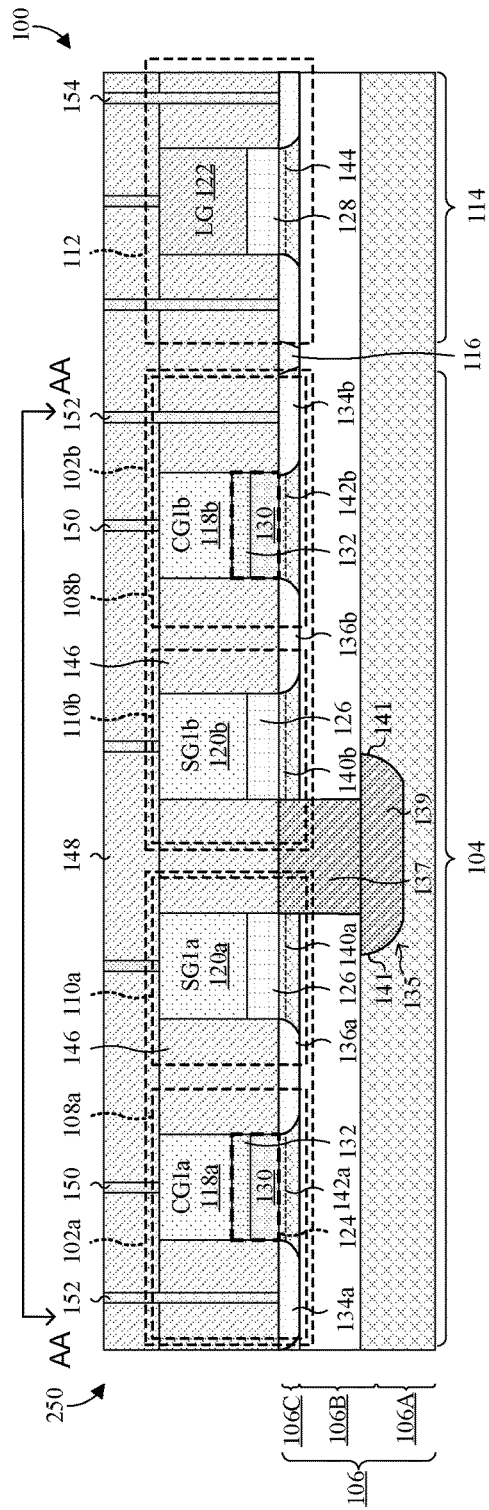
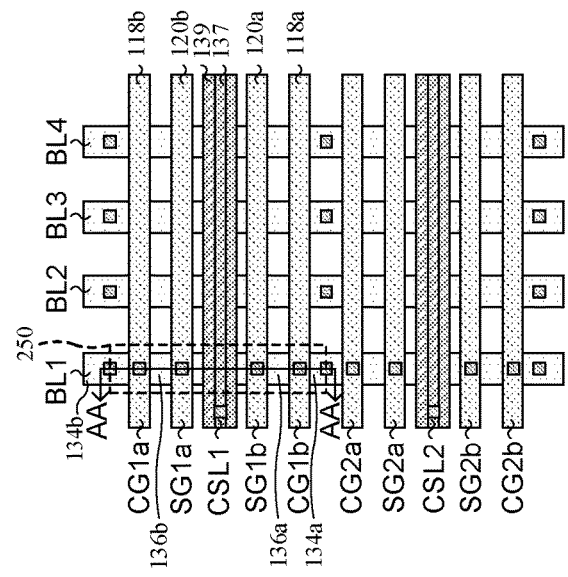
Fig. 1C
Fig. 2

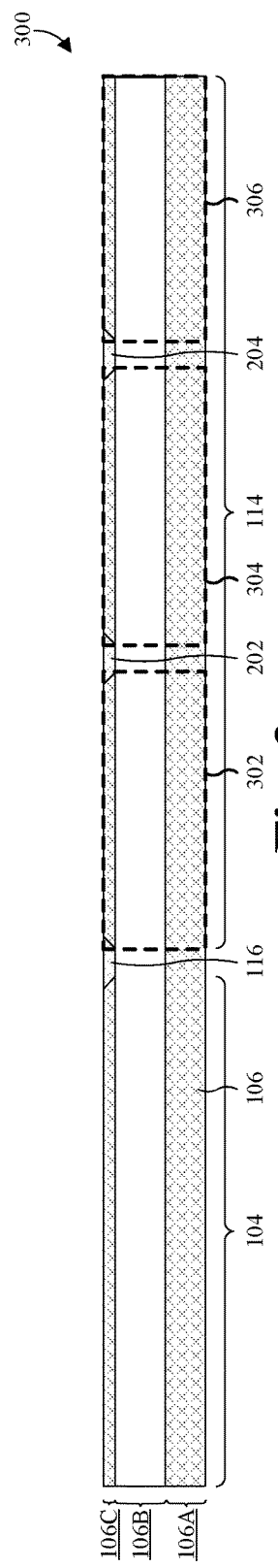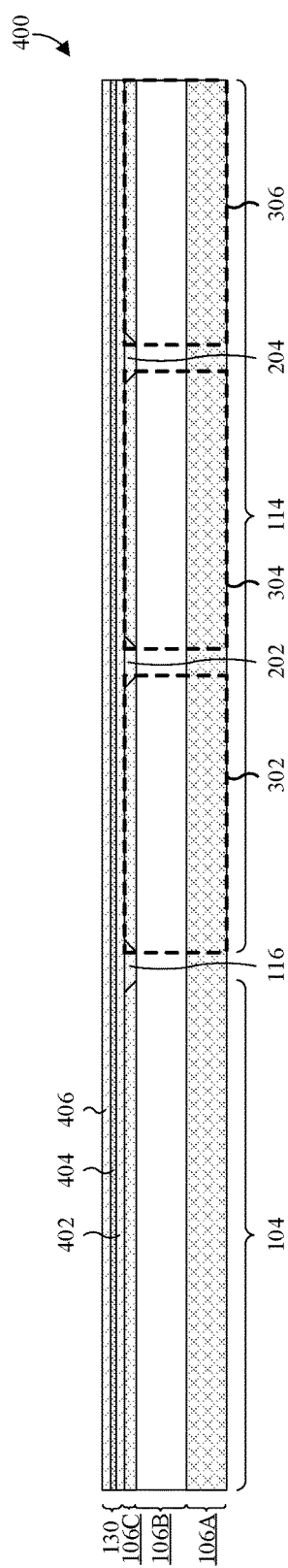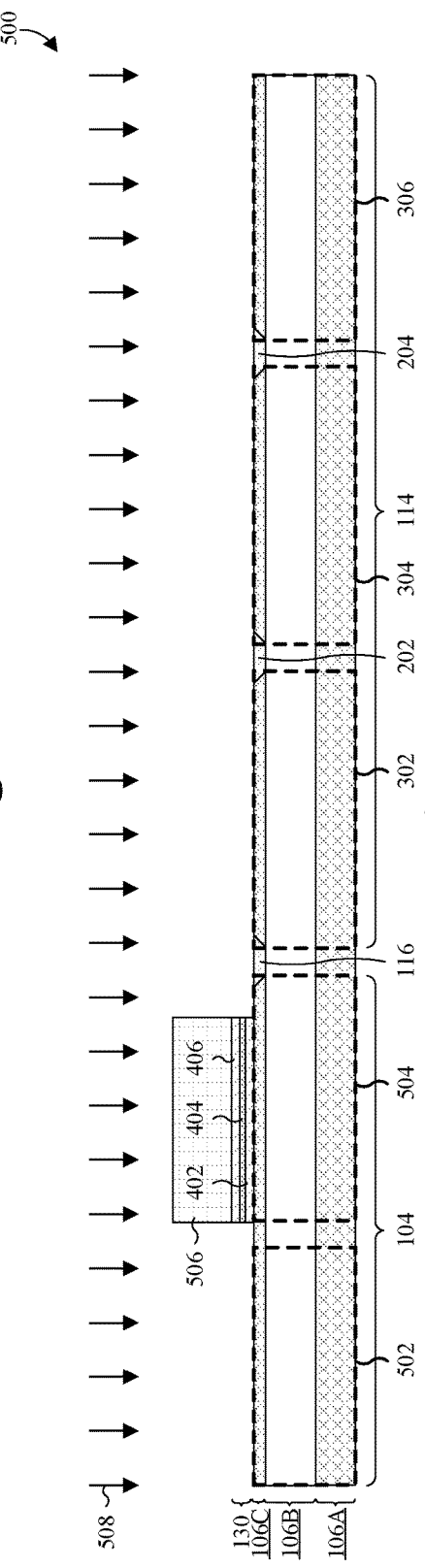

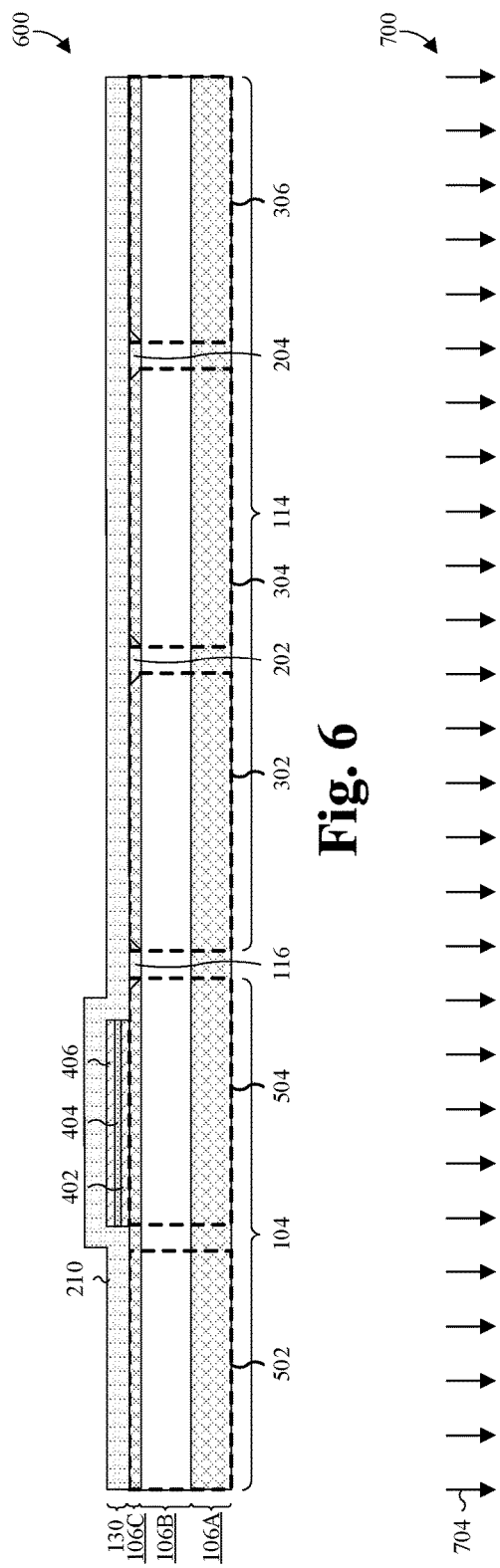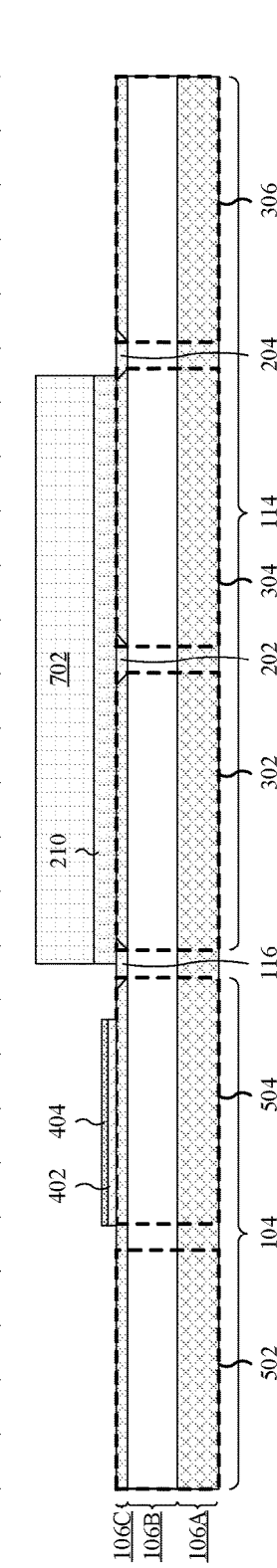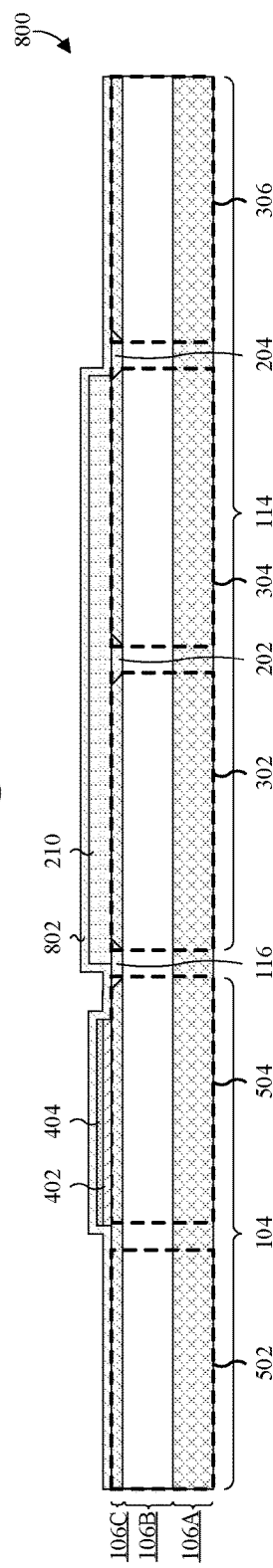

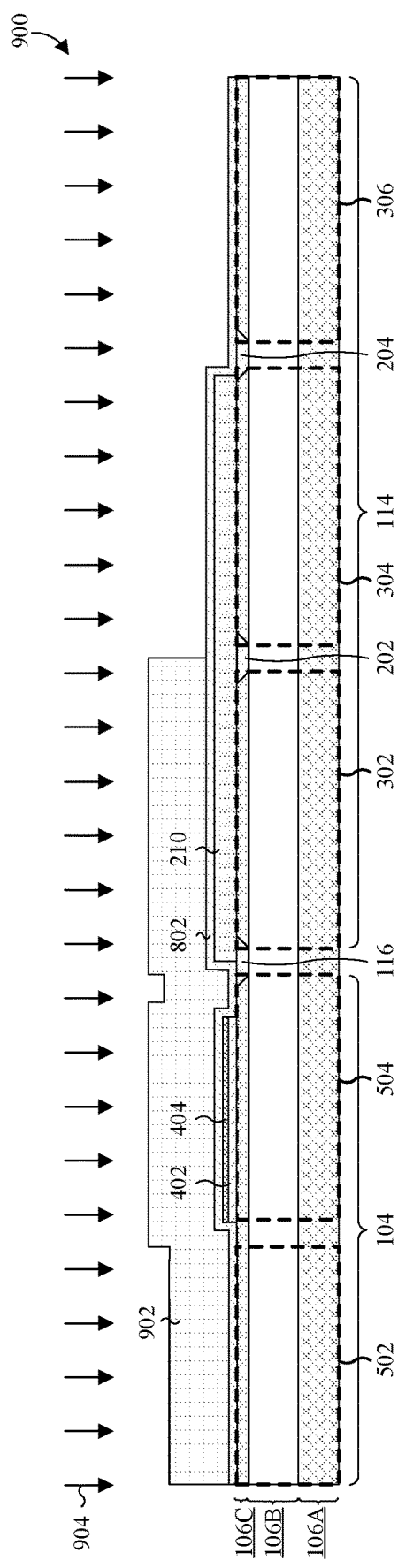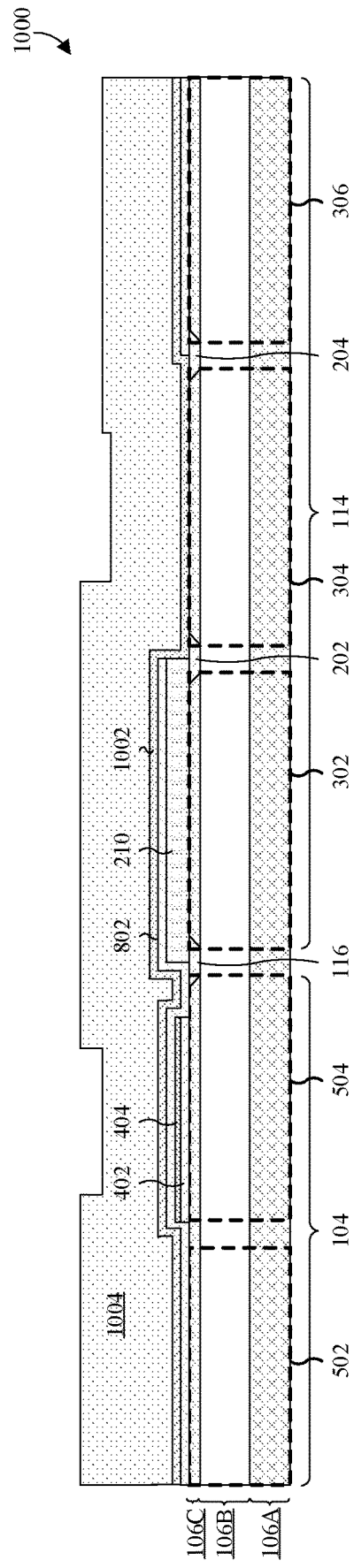

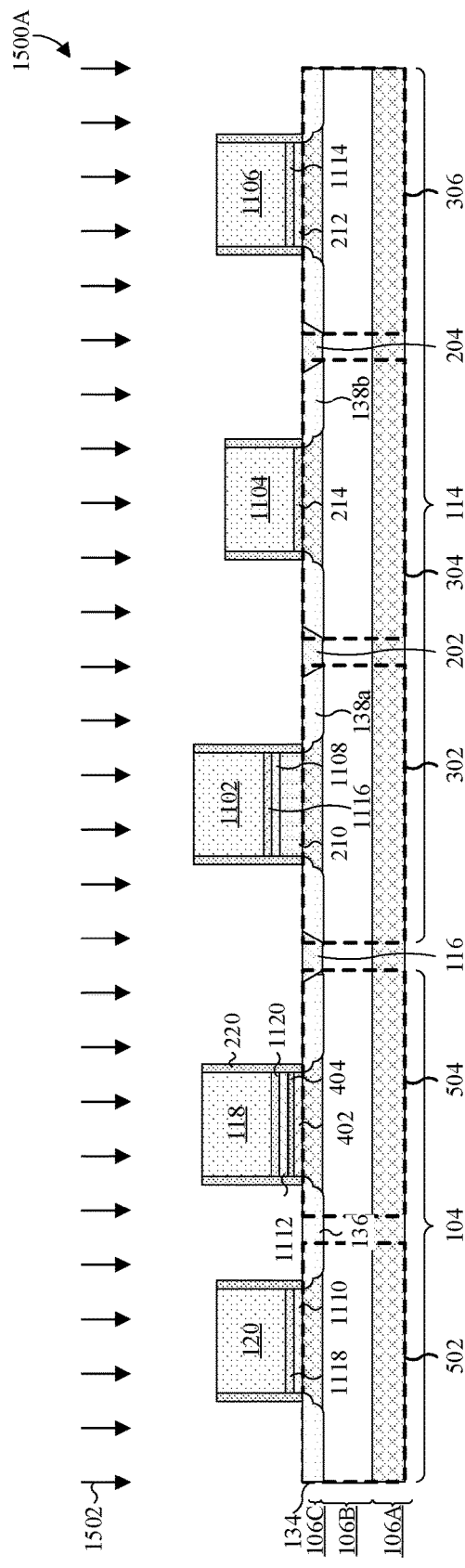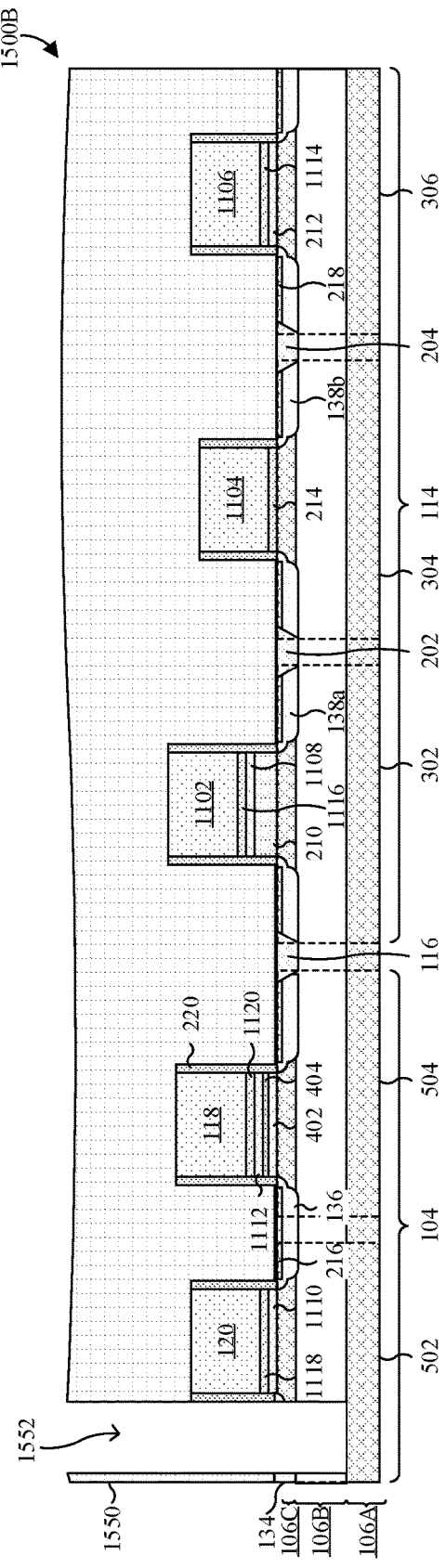
Fig. 15A
Fig. 15B

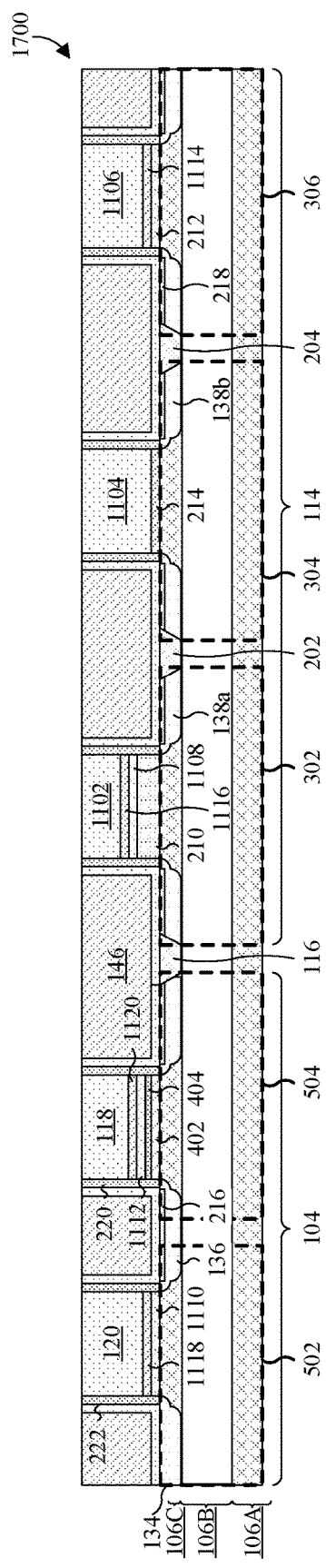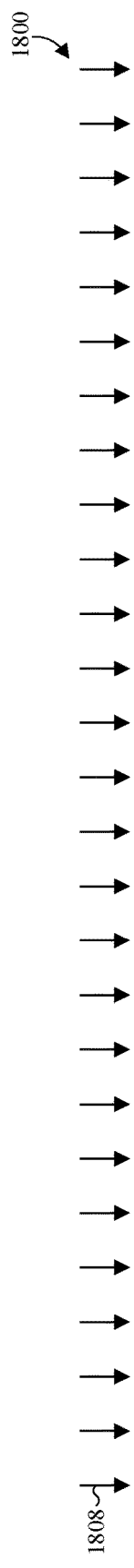

EMBEDDED MEMORY USING SOI STRUCTURES AND METHODS

REFERENCE TO RELATED APPLICATIONS

This Application is a Continuation of U.S. application Ser. No. 16/560,055, filed on Sep. 4, 2019, which is a Divisional of U.S. application Ser. No. 16/015,446, filed on Jun. 22, 2018 (now U.S. Pat. No. 10,879,256, issued on Dec. 29, 2020), which claims the benefit of U.S. Provisional Application No. 62/589,801, filed on Nov. 22, 2017. The contents of the above-referenced Patent Applications are hereby incorporated by reference in their entirety.

BACKGROUND

Embedded memory is electronic memory that is integrated with logic devices on a common integrated circuit (IC) die or chip. The embedded memory supports operation of the logic devices and is often used with very-large-scale integration (VLSI) IC dies or chips. The integration advantageously improves performance by eliminating interconnect structures between chips and advantageously reduces manufacturing costs by sharing process steps between the embedded memory and the logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a cross-sectional view of some embodiments of an integrated circuit (IC) using high-κ metal gate (HKMG) technology and comprising an embedded silicon-oxide-nitride-oxide-silicon (SONOS) memory cell.

FIG. 1B illustrates a cross-sectional view of some more detailed embodiments of the IC of FIG. 1.

FIG. 1C illustrates a cross-sectional view of some embodiments of an embedded memory IC with a buried common source line.

FIG. 2 illustrates a top view of some embodiments in accordance with FIG. 1C.

FIGS. 3-22 illustrate a series of cross-sectional views of some embodiments for manufacturing an IC with an embedded SONOS memory cell.

DETAILED DESCRIPTION

Figure 11:
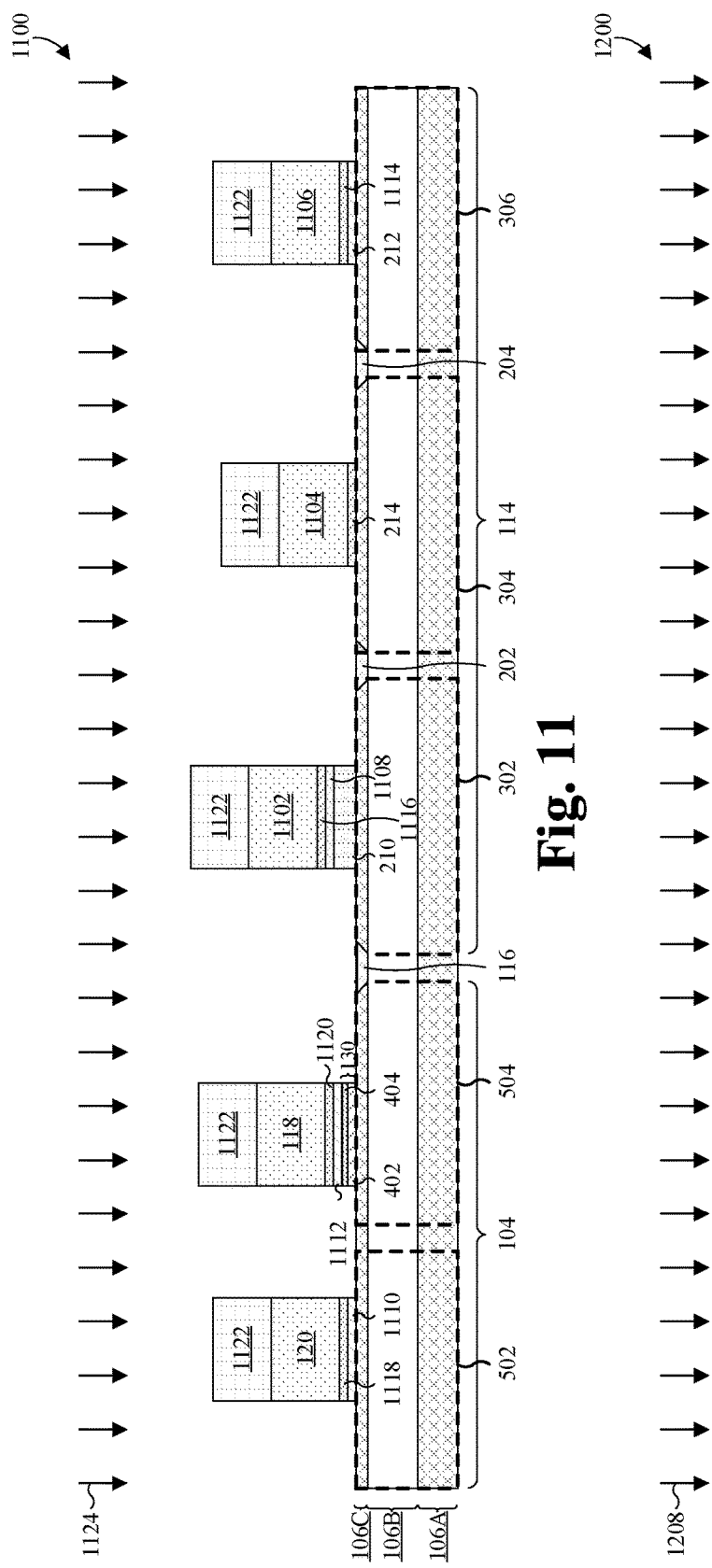

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuits (ICs) comprise logic devices and embedded memory. The logic devices comprise respective polysilicon logic gates arranged over and vertically spaced from a semiconductor substrate by respective logic dielectric regions. The embedded memory comprises an array of memory cells, such as static random access memory cells (SRAM), dynamic random access memory cells (DRAM), flash memory cells, or other types of memory cells. In some embodiments, each memory cell can take the form of a two transistor (2T) silicon-oxide-nitride-oxide-silicon (SONOS) memory cell or 2T metal-oxide-nitride-oxide-silicon (MONOS) memory cell, for example. A 2T SONOS memory cell comprises a polysilicon control gate and a polysilicon select gate laterally spaced over the semiconductor substrate. A MONOS memory cell is similar, but a metal control gate and metal select gate are substituted for the polysilicon control gate and polysilicon select gate. One challenge with the foregoing ICs is that the ICs are reaching performance and/or scaling limits. Performance may be quantified in terms of, for example, power consumption and/or switching speed. In addition, integration of SONOS/MONOS memory cells and logic devices is challenging in some cases.

The present application in various embodiments is directed towards an IC that includes logic devices and embedded memory cells on a semiconductor-on-insulator (SOI) substrate. The SOI substrate includes a lower semiconductor portion—so called "handle" substrate—that provides structural integrity; an insulator layer over the handle substrate; and a semiconductor device layer over the insulator layer. By using an SOI substrate (rather than using a traditional bulk silicon substrate), the embedded memory cells can achieve lower current leakage, lower power consumption, and is more compatible with the manufacturing process for logic devices, compared to other approaches using a bulk (e.g., monocrystalline) substrate. This is largely due to the presence of the insulator layer within the SOI substrate, which provides good isolation for the logic devices and embedded memory cells. Compared to a traditional bulk substrate, the SOI substrate lowers parasitic capacitance, and lowers device leakage and provides greater resistance to latch-up. For example, in some cases, the logic device can manifest as a high-κ metal gate (HKMG) logic device, and the embedded memory cell can manifest as an embedded SONOS or MONOS memory cell. When the HKMG logic device and SONOS/MONOS memory cell are arranged on a SOI substrate having a silicon dioxide insulator layer, the insulator layer of the SOI substrate reduces current leakage and power consumption for the SONOS/MONOS memory cell. Further, by incorporating the HKMG logic device with the SONOS or MONOS memory cell over the SOI substrate, the IC achieves good performance, low power consumption, and scaling. Further, the metal gate and the high κ layer lower leakage current, increase maximum drain current, mitigate fermi-level pinning, and lower a threshold voltage for the logic device.

The present application in various embodiments is also directed towards a method for manufacturing the IC. In some embodiments, a control gate, a select gate, and a dummy gate are formed of polysilicon (or metal) and laterally spaced over an SOI substrate. The dummy gate is subsequently removed to form a gate opening, and a high κ layer is formed in the gate opening. Further, a logic gate of metal is formed in the gate opening. By forming the high κ layer and the metal gate last, manufacturing costs are low and process length is short. Further, the SOI substrate can be employed without changing a manufacturing process for a SONOS/MONOS memory cell and integrated logic device. The following description may refer to SONOS memory cells, but it is to be appreciated that it is also applicable to MONOS memory cells as well as other types of memory cells, such as SRAM, DRAM, etc.

With reference to FIG. 1A, a cross-sectional view 100 of some embodiments of an IC is provided. As illustrated, the IC is disposed on an SOI substrate 106 which includes a handle substrate 106A, an insulator layer 106B over the handle substrate 106A, and a semiconductor device layer 106C over the insulator layer 106B.

The IC includes a pair of embedded SONOS memory cells 102a, 102b and a logic device 112. The memory cells 102a, 102b are arranged on a memory region 104 of the SOI substrate 106, and may be symmetrical about a central axis 103 of the pair of embedded SONOS memory cells in some cases. Memory cell 102a includes a control transistor 108a and a select transistor 110a, and memory cell 102b includes a control transistor 108b and a select transistor 110b. Further, the logic device 112 is arranged on a logic region 114 of the SOI substrate 106. The memory region 104 and the logic region 114 are laterally adjacent to one another and, in some embodiments, spaced from one another by an isolation region 116.

Respective gates 118a, 118b, 120a, 120b of the memory cells 102a, 102b and gate 122 of the logic device 112 are arranged over and vertically spaced from the SOI substrate 106 by respective dielectric regions 124, 126, 128. In some embodiments, upper or top surfaces of the gates 118, 120, 122 are at a substantially same level, or in some cases are substantially coplanar. The gates comprise control gates (CG) 118a, 118b and select gates (SG) 120a, 120b arranged laterally adjacent to one another and corresponding to the control transistors 108a, 108b and select transistors 110a, 110b. Further, the gates 118a, 118b, 120a, 120b, 122 comprise a logic gate (LG) 122 corresponding to the logic device 112. The control gates 118a, 118b and select gates 120a, 120b include a first material, and the logic gate 122 includes a second material. In some embodiments, the first material is doped polysilicon, and the second material is metal.

The dielectric regions 124, 126, 128 comprise a control dielectric region 124, a select dielectric region 126, and a logic dielectric region 128 corresponding to the control, select, and logic gates 118, 120, 122. The control dielectric region 124 comprises a charge-trapping layer 130 and, in some embodiments, an overlying dielectric subregion 132. Further, the logic dielectric region 128 comprises or otherwise is a high κ layer (i.e., a dielectric layer with a dielectric constant κ greater than about 3.9).

Advantageously, in various embodiments incorporating HKMG technology into the logic device 112, the IC achieves good performance, low power consumption, and small scale. The metal gate and the high κ layer lower leakage current, increase maximum drain current, mitigate fermi-level pinning, and lower a threshold voltage for the logic device 112.

Respective source/drain regions 134a, 134b, 136a, 136b, 138 of the gates 118a, 118b, 120a, 120b, 122 are arranged in an upper surface the SOI substrate 106. Memory cells 102a, 102b include individual source/drain regions 134a, 134b, intermediate source/drain regions 136a, 136b, and common drain region 138 that is shared or "common" to memory cells 102a, 102b. The individual source/drain regions 134a, 134b are arranged on opposite sides of the control gates 118a, 118b; the intermediate source/drain regions 136a, 136b are arranged between the respective control gates 118a, 118b and select gates 120a, 120b; and the common source/drain region 138 is arranged between the select gates 120a, 120b. The source/drain regions are separated from one another by respective channel regions under the gates. For example, control channel regions 142a, 142b are arranged under the control gates 118a, 118b; select channel regions 140a, 140b are arranged under the select gates 120a, 120b; and logic channel 144 is arranged under logic gate 122. The source/drain regions 134a, 134b, 136a, and 138 have lower surfaces that directly contact an upper surface of the insulator layer 106B in various embodiments. In some cases, the channel region between the source/drain regions can have a lower doping (e.g., no doping or intrinsic doping), compared to conventional approaches, because of the presence of the SOI substrate rather than a bulk substrate. For instance, the control gate well doping can range from 1E15 atoms/cm3 to 1E17 atoms/cm3, which is lower than is used in conventional bulk substrates, due to the better channel control in FDSOI. This lighter well doping can achieve a tighter Vt distribution for the control gate, since the lighter well doping can have less random doping fluctuation and thus smaller Vt standard deviation.

In various embodiments, the SOI substrate is a fully depleted. SOI (FDSOI) substrate. In various embodiments, the FDSOI substrate has a sufficiently thin semiconductor device layer 106C, such that during operation of the memory cell 102a, 102b and/or the logic device 112, the depletion region in the channel region of the memory cell 102a, 102b and/or the logic device 112 extends fully across the depth of the semiconductor device layer 106C. For example, in various embodiments, the semiconductor device layer 106C is a monocrystalline silicon layer having a thickness ranging from 5 nm to 40 nm, and being approximately 10 nm to 12 nm thick in some cases; and the insulator layer 106B is a silicon dioxide or sapphire layer having a thickness ranging from 10 nm to 60 nm, and being approximately 25 nm thick in some cases, which can provide FDSOI functionality. In contrast, a partially depleted SOI MOSFET has a semiconductor device layer 106C that is thicker than that of a FDSOI substrate so the depletion region extends only partially through the semiconductor device layer 106C in the PDSOI substrate (e.g., through less than 100% of the thickness of the semiconductor device layer 106C in the PDSOI substrate).

A first interlayer dielectric (ILD) layer 146 is arranged laterally between the control, select, and logic gates 118a, 118b, 120a, 120b, 122 and, in some embodiments, has an upper or top surface that is at a substantially same level with (or in some cases substantially coplanar with) the upper or top surfaces of the control, select, and logic gates 118a, 118b, 120a, 120b, 122. A second ILD layer 148 is arranged over the first ILD layer 146 and, in some embodiments, has a lower or bottom surface that is at a substantially same level with (or in some cases are substantially coplanar with) the upper or top surfaces of the control, select, and logic gates 118a, 118b, 120a, 120b, 122. Contacts 150, 152, 154 extend vertically through the first and second ILD layers 146, 148 to one or more of the source/drain regions 134a, 134b, 136a, 136b, 138 and/or one or more of the control, select, and logic gates 118a, 118b, 120a, 120b, 122.

In operation, the charge-trapping layer 130 within each memory cell stores charge and selectively toggles between different amounts of stored charge respectively representing a logic "0" and a logic "1". In this way, each of the SONOS memory cells 102a, 102b can store its own bit of data, or if higher resolution of the quantized amount of charge is used, multiple bits can be stored in each memory cell. For instance, to read the amount of stored charge in SONOS memory cell 102a, in some embodiments, bias circuitry applies a bias voltage to the control gate 118a, such that the control channel region 140a underlying the control gate 118a selectively conducts depending upon the amount of stored charge. Depending upon whether the control channel region 140a conducts, the charge-trapping layer 130 stores a logic "0" or a logic "1". Since the stored charge screens an electric field produced by the control gate 118a, the threshold voltage to induce the control channel region 140a to conduct varies with the amount of stored charge. Therefore, the bias voltage is chosen between the threshold voltages at different amounts of stored charge. To add charge to the charge-trapping layer 130, in some embodiments, the bias circuitry biases the control and select gates 118a, 120a respectively with comparatively high and low voltages to promote hot carrier injection. To remove charge in the charge-trapping layer 130, in some embodiments, the bias circuitry biases the control gate 118a with a high voltage of opposite polarity as charge stored in the charge-trapping layer 130 to promote Fowler-Nordheim tunneling (FNT) of the charge out of the charge-trapping layer 130.

For example, in some embodiments, an erase operation can be carried out on a memory cell (e.g., 102a) by biasing the common source/drain (e.g., 138) to +4V, the individual source/drain (e.g., 134a) to +4V, the select gate (e.g., 120a) to +4V, and the control gate (e.g., 118a) to −3.5 V. Further, a program operation can be carried out by biasing the common source/drain (e.g., 138) to −3.5 V, the individual source/drain (e.g., 134a) to −3.5 V, the select gate (e.g., 120a) to −3.5 V, and the control gate to +4 V. Further still, a program inhibit operation can be carried out by biasing the common source/drain (e.g., 138) to −3.5 V, the individual source/drain (e.g., 134a) to +1.1 V, the select gate (e.g., 120a) to −3.5 V, and the control gate to +4 V. Further still, a read operation can be carried out by biasing the common source/drain (e.g., 138) to 0 V, the individual source/drain (e.g., 134a) to 0.5 V, the select gate (e.g., 120a) to 2.5 V, and the control gate (e.g., 118a) to 0 V. Further, in some embodiments, the program inhibit operation can use a reduced individual source/drain voltage that is less than what is used in conventional approaches that use a bulk substrate. For example, in some embodiments, the program inhibit operation can use an individual source/drain voltage of between 0 V and +1.1 V, and in some cases the individual source/drain voltage can range between +0.5 V and +0.9V. This reduced individual source/drain voltage can achieve the same Vt window, due to better inhibit efficiency of the FDSOI substrate compared to a bulk substrate.

These voltages are merely non-limiting examples, and it will be appreciated that in other embodiments, other voltages can be used. For example, in some other embodiments a program operation can be performed by biasing the common source/drain (e.g., 138) to between −5 and −2 V, the individual source/drain (e.g., 134a) to between −5 V and −2 V, the select gate (e.g., 120a) to between −5 V and −2 V, and the control gate (e.g., 118a) to between +2 V and +8V. Further, a program inhibit operation can be carried out by biasing the common source/drain (e.g., 138) to between −5 V and −2 V, the individual source/drain (e.g., 134a) to between −3 V and −0.5 V, the select gate (e.g., 120a) to between −5 V and −2 V, and the control gate (e.g., 118a) to between +2 V and +8 V. Further still, a read operation can be carried out by biasing the common source/drain (e.g., 138) to 0 V, the individual source/drain (e.g., 134a) to between 0.1 V and 1 V, the select gate (e.g., 120a) to between 1 V and 4 V, and the control gate (e.g., 118a) to 0 V.

While the IC has been described with regard to embedded 2T SONOS memory cells 102a, 102b, it is to be appreciated that other types of embedded memory cells are amenable. For example, the IC may comprise an embedded memory cell with control and select gates that include metal (rather than polysilicon) to achieve a MONOS memory cell. SRAM, DRAM, and other types of flash, among others, are also contemplated as falling within the scope of this disclosure.

With reference to FIG. 1B, a cross-sectional view 200 of some more detailed embodiments of the IC of FIG. 1A, albeit with only one memory cell 102b illustrated and three logic devices 112a, 112b, and 112c illustrated. As illustrated, the embedded memory cell 102b is arranged on a memory region 104 of SOI substrate 106, and a plurality of logic devices 112a, 112b, 112c is arranged on a logic region 114 of the SOI substrate 106. The embedded memory cell 102b may be, for example, a 2T SONOS memory cell, and/or may comprise, for example, a control transistor and a select transistor. The logic devices 112a-112c may comprise, for example, a first logic device 112a, a second logic device 112b, a third logic device 112c, or a combination of the foregoing. The first logic device 112a may be, for example, a high voltage transistor, the second logic device 112b may be, for example, a single-gate-oxide transistor, and the third logic device 112c may be, for example, a dual-gate-oxide transistor.

The memory region 104 and the logic region 114 are laterally adjacent to one another and, in some embodiments, spaced from one another by a first isolation region 116. Further, in some embodiments, the logic devices 112a-112c are laterally spaced from one another by second isolation regions 202, 204. The first and/or second isolation regions 116, 202, 204 may be, for example, shallow trench isolation (STI) regions, deep trench isolation (DTI) regions, implant isolation regions, or a combination of the foregoing. The first and/or second isolation regions 116, 202, 204 can extend down through the semiconductor device layer 106C and have lower surfaces in direct contact with an upper surface of the insulator layer 106B.

Respective gates 118b, 120b, 122a, 122b, 122c of the memory cell 102b and the logic devices 112a-112c are arranged over and vertically spaced from the SOI substrate 106 by respective dielectric regions 124, 126, 128a, 128b, 128c. In some embodiments, upper or top surfaces of the gates 118b, 120b, 122a-122c are at a substantially same level, or in some cases are substantially coplanar. Further, in some embodiments, heights of the gates 118b, 120b, 122a-122c are different from one another. The gates 118b, 120b, 122a-122c comprise a control gate 118b and a select gate 120b arranged laterally adjacent to one another and both corresponding to the memory cell 102b. Further, the gates 118b, 120b, 122a-122c comprise logic gates 122a-122c corresponding to the logic devices 112a-112c. The control and select gates 118b, 120b are a first material, and the logic gates 122a-122c are a second material. In some embodiments, the first material includes doped polysilicon or some other silicon, and/or the second material includes metal. The metal may be or otherwise comprise, for example, titanium, tantalum, tungsten, copper, aluminum copper, or aluminum.

The dielectric regions 124, 126, 128a-128c are arranged between the gates 118b, 120b, 122a-122c and the SOI substrate 106 to insulate and space the gates 118b, 120b, 122a-122c from the semiconductor device layer 106c. In some embodiments, the dielectric regions 124, 126, 128a-128c comprise lower or bottom surfaces that are at a substantially same level, or in some cases are substantially coplanar and/or have varying heights $H_1$, $H_2$, $H_3$, $H_4$, $H_5$. The dielectric regions 124, 126, 128a-128c comprise a control dielectric region 124, a select dielectric region 126, and logic dielectric regions 128a-128c corresponding to the control, select, and logic gates 118b, 120b, 122a-122c.

The logic dielectric regions 128a-128c in various embodiments comprise respective high κ layers 208a, 208b, 208c lining lower or bottom surfaces of the logic gates 122a-122c. In some embodiments, the high κ layers 208a-208c further line sidewall surfaces of the logic gates 122a-122c and/or directly abut the logic gates 122a-122c. The high κ layers 208a-208c may, for example, be or otherwise comprise hafnium oxide, hafnium silicon oxide, hafnium aluminum oxide, hafnium tantalum oxide, zirconium silicate, or zirconium oxide.

The control dielectric region 124 comprises a charge-trapping layer 130 configured to store charge. In some embodiments, the charge-trapping layer 130 is or otherwise comprises an oxide-nitride-oxide (ONO) structure or an oxide-nanocrystal-oxide (ONCO) structure. The ONO structure may comprise, for example, a first oxide layer, a nitride layer arranged over and abutting the first oxide layer, and a second oxide layer arranged over and abutting the nitride layer. The first and second oxide layers may include, for example, silicon dioxide, and/or the nitride layer may be, for example, silicon nitride. The ONCO structure may comprise, for example, the first oxide layer, a layer of nanocrystals arranged over and abutting the first oxide layer, and the second oxide layer arranged over and abutting the layer of nanocrystals. The layer of nanocrystals may include, for example, a layer of silicon dots.

In some embodiments, the dielectric regions 128a-128c respectively comprise dielectric layers 210, 212, 214 underlying the high κ layers 208a-208c and/or overlying the charge-trapping layer 130. For example, a first logic dielectric region 128a may comprise a first dielectric layer 210; the second logic dielectric region 128b may comprise a second dielectric layer 212, and the third logic dielectric region 128c may comprise a third dielectric layer 214. In some embodiments, the first dielectric layer 210 is a high voltage gate oxide having a height $H_3$ ranging between 90 Angstroms and 250 Angstroms; the second dielectric layer 212 is a low voltage gate oxide having a height $H_4$ ranging between 10 Angstroms and 25 Angstroms; and the third dielectric layer 214 is a mid-level voltage oxide having a height ranging from 90 Angstroms to 250 Angstroms. More detailed embodiments of how the first, second, and third dielectric layers 210, 212, 214 can be formed and corresponding structural features may be found in the manufacturing flow that follows in FIGS. 3-22, for example.

Respective source/drain regions 134b, 136b, 138, 139 are arranged in an upper region of the semiconductor device layer 106C of the SOI substrate 106. The source/drain regions 134b, 136b, 138, 139 are arranged on opposite sides of the gates 118b, 120b, 122a-122c and define respective channel regions 140b, 142b, 144a, 144b, 144c under the gates 120b, 118b, 122a-122c, respectively. The channel regions 140b, 142b, 144a-144c selectively conduct depending upon biases applied to the gates 120b, 118b, 122a-122c. The source/drain regions 134b, 136b, 138, 139 may be, for example, doped regions having an opposite doping type (n- or p-type) as surrounding regions of the SOI substrate 106. Further, the source/drain regions 134b, 136b, 138, 139 may be, for example, covered by silicide layers 216, 218. In some embodiments, the silicide layers 216, 218 include nickel silicide or titanium silicide.

In some embodiments, a main sidewall structure 220 and/or a contact etch stop layer (CESL) 222 line sidewalls of the gates 118, 120, 122a-122c. Further, in some embodiments, the CESL 222 extends laterally to cover the source/drain regions 134, 136, 138a, 138b, and/or to cover the first and/or second isolation regions 116, 202, 204. Even more, in some embodiments, the main sidewall structure 220 is arranged laterally between the CESL 222 and the gates 118b, 120b, 122a-122c, and/or is arranged laterally between the CESL 222 and the high κ layers 208a-208c. Moreover, in some embodiments, upper or top surfaces of the main sidewall structure 220 and/or CESL 222 are at a substantially same level with the upper or top surfaces of the gates 118b, 120b, 122a-122c. The main sidewall structure 220 and/or the CESL 222 may include, for example, silicon dioxide, silicon nitride, or some other dielectric.

A first ILD layer 146 is arranged laterally between the gates 118b, 120b, 122a-122c and, in some embodiments, has an upper or top surface that is at a substantially same level with the upper or top surfaces of the gates 118b, 120b, 122a-122c. A second ILD layer 148 is arranged over the first ILD layer 146 and, in some embodiments, has a lower or bottom surface that is at a substantially same level with the upper or top surfaces of the gates 118b, 120b, 122a-122c. The first and/or second ILD layers 146, 148 may include, for example, an oxide, polysilicate glass (PSG), a dielectric material with a dielectric constant less about 3.9 (i.e., a low κ dielectric material), or some other dielectric material. Contacts 150, 152, 154a, 154b extend vertically through the first and second ILD layers 146, 148 to one or more of the source/drain regions 134b, 136b, 138, 139 and/or one or more of the gates 118b, 120b, 122a-122c. The contacts 150, 152, 154a, 154b may include, for example, tungsten, copper, aluminum copper, or some other conductive material.

While the IC of FIG. 1B is illustrated with multiple logic devices 112a-112c, more or less logic devices are amenable. For example, the IC of FIG. 1B may omit the first and third logic devices 112a, 112c. As another example, the IC of FIG. 1B may omit the first and second logic devices 112a, 112b. As yet another example, the IC of FIG. 1B may omit the second and third logic devices 112b, 112c.

FIG. 1C and FIG. 2 illustrate yet another embodiment of an IC, with FIG. 1C showing a cross-sectional view of the IC and FIG. 2 illustrating a top view of the IC. With reference to FIG. 2, the top view depicts an array of SONOS memory cells made up of eight SONOS memory cell pairs, arranged in four columns and two rows. For ease of viewing, only one SONOS memory cell pair 250 is labeled in FIG. 2, and it will be appreciated memory arrays can include any number of SONOS memory cell pairs and thus FIG. 2 is merely an example. Also, other types of memory cells, such as MONOS memory cells for example, can be included in place of the SONOS memory cell pairs. Further, in NAND flash configurations, each memory cell pair may include a single select gate and a string of multiple control gates arranged in series with one another and accessible via the select gate. Bitlines (BL) extend along respective columns of the memory array, while a pair of control gates (CG) and a pair of select gates (SG) extend along each pair of SONOS cells along a row. For example, a first bitline BL1 extends along the first column, a second bitline BL2 extends along the second column, and so on. Further, a first pair of control gates (CG1a, CG1b), a first pair of select gates (SG1a, SG1b), and a first common source line (CSL1) extend along the first row; while a second pair of control gates (CG2a, CG2b), a second pair of select gates (SG2a, SG2b), and a second common source line (CSL2) extend along the second row; and so on.

As seen in FIG. 1C's cross-section, the embedded SONOS memory cell pair 250 includes a first SONOS memory cell 102a and a second SONOS memory cell 102b. The memory cells 102a, 102b are arranged on a memory region 104 of the SOI substrate 106. Memory cell 102a includes a control transistor 108a and a select transistor 110a, and memory cell 102b includes a control transistor 108b and a select transistor 110b. Further, a logic device 112 is arranged on a logic region 114 of the SOI substrate 106. The memory region 104 and the logic region 114 are laterally adjacent to one another and, in some embodiments, spaced from one another by an isolation region 116.

As illustrated in FIG. 1C, the SONOS memory cell pair 250 includes a common source/drain region 135 that is shared between the first SONOS memory cell 102a and the second SONOS memory cell 102b. The common source/drain region 135 includes an epitaxial line 137 that extends vertically between an upper surface of the semiconductor device layer 106C and a lower surface of the insulator layer 106B. The epitaxial line 137 is typically made of doped monocrystalline silicon. The epitaxial line 137 directly contacts a doped region 139 disposed within the handle substrate 106A. The doped region 139, which is typically formed by ion implantation and a subsequent anneal, extends outwardly under the lower surface of the handle substrate 106A and meets the handle substrate 106A at a junction with rounded edges 141. The epitaxial line 137 and doped region 139 have the same doping type, and are the same doping type as the source/drain regions 134a, 134b, 136a, 136b. The doped region 139 has outermost edges 141 that are arranged directly under the select gates 120a, 120b. For example, the doped region 139 may extend under approximately 5%, 10%, 30%, or 50% of each select gate 120a, 120b in some embodiments.

As illustrated in FIG. 2, the epitaxial line 137 and doped region 139 extend continuously between multiple memory cell pairs of multiple respective columns of the array. Thus, the epitaxial line 137 and doped region 139 act as a common source line (CSL) coupled to multiple SONOS memory cell pairs along a row in the memory array. Because the epitaxial line 137 and doped region 139 extend deeper into the substrate than traditional approaches, the epitaxial line 137 and doped region 139 have a larger cross-sectional area and a lower effective resistance than traditional source lines, which provides higher efficiency program, erase, program inhibit, and read operations during operation.

With reference to FIGS. 3-22, a series of cross-sectional views of some embodiments of a high-κ-last method for manufacturing an IC with an embedded SONOS memory cell is provided.

As illustrated by the cross-sectional view 300 of FIG. 3, a first isolation region 116 is formed on an upper side of a SOI substrate 106 to laterally space a memory region 104 of the SOI substrate 106 from a logic region 114 of the SOI substrate 106. Further, one or more second isolation regions 202, 204 are formed on the upper side of the SOI substrate 106 to divide the logic region 114 into logic device regions 302, 304, 306. The logic device regions 302, 304, 306 may, for example, correspond to different device types, such as high voltage transistors and dual-gate-oxide transistors. In some embodiments, the first and second isolation regions 116, 202, 204 are formed concurrently. Further, in some embodiments, the process for forming the first and/or second isolation regions 116, 202, 204 comprises etching into the SOI substrate 106 to form trenches and subsequently filling the trenches with a dielectric material.

As illustrated by the cross-sectional view 400 of FIG. 4, a charge-trapping layer 130 is formed covering the SOI substrate 106 and the first and second isolation regions 116, 202, 204. In some embodiments, the charge-trapping layer 130 comprises a first oxide layer 402, a nitride or nanocrystal layer 404 arranged over the first oxide layer 402, and a second oxide layer 406 arranged over the nitride or nanocrystal layer 404. The first and second oxide layers 402, 406 may be, for example, silicon dioxide, and/or the nitride or nanocrystal layer 404 may be, for example, silicon nitride or silicon nanocrystals. Further, in some embodiments, the nitride or nanocrystal layer 404 is arranged directly on the first oxide layer 402, and/or the second oxide layer 406 is arranged directly on the nitride or nanocrystal layer 404. The process for forming the charge-trapping layer 130 may, for example, comprise sequentially forming the first oxide layer 402, the nitride or nanocrystal layer 404, and the second oxide layer 406. The first and second oxide layers 402, 406 and the nitride or nanocrystal layer 404 may be formed by, for example, thermal oxidation, chemical vapor deposition (CVD), physical vapor deposition (PVD), atomic layer deposition (ALD), or a combination of the foregoing.

As illustrated by the cross-sectional view 500 of FIG. 5, a first etch is performed into the charge-trapping layer 130. The first etch localizes the charge-trapping layer 130 to a select transistor region 502 of the memory region 104 that is laterally adjacent to a control transistor region 504 of the memory region 104. The process for performing the first etch may, for example, comprise depositing and patterning a first photoresist layer 506 over the charge-trapping layer 130 so as to mask a region of the charge-trapping layer 130 localized to the select transistor region 502. Further, the process may, for example, comprise applying one or more etchants 508 to the charge-trapping layer 130 while using the first photoresist layer 506 as a mask. Even more, the process may comprise, for example, subsequently removing or otherwise stripping the first photoresist layer 506.

As illustrated by the cross-sectional view 600 of FIG. 6, a first dielectric layer 210 is formed covering the charge-trapping layer 130 and exposed regions of the SOI substrate 106. The first dielectric layer 210 may be, for example, silicon dioxide or some other oxide. Further, the first dielectric layer 210 may be formed by, for example, one or more of thermal oxidation, CVD, PVD, or ALD. In some embodiments, the first dielectric layer 210 is formed conformally (e.g., with a substantially uniform thickness).

As illustrated by the cross-sectional view 700 of FIG. 7, a second etch is performed into the first dielectric layer 210 to localize the first dielectric layer 210 to first and second logic device regions 302, 304. The process for performing the second etch may, for example, comprise depositing and patterning a second photoresist layer 702 over the first dielectric layer 210 so as to mask a region of the first dielectric layer 210 localized to the first and second logic device regions 302, 304. Further, the process may comprise, for example, applying one or more etchants 704 to the first dielectric layer 210 while using the second photoresist layer 702 as a mask. The etchants 704 remove the un-masked portion of the first dielectric layer 210, and to help ensure the un-masked portion of the first dielectric layer 210 is fully cleared, the etchants 704 may also fully remove the second oxide layer 406 and stop on the nitride or nanocrystal layer 404. In other embodiments, the etchants 704 may leave some portions of the second oxide layer 406 in place (not shown). Even more, the process may comprise, for example, subsequently removing or otherwise stripping the second photoresist layer 702.

As illustrated by the cross-sectional view 800 of FIG. 8, a second dielectric layer 802 is formed lining the charge-trapping layer 130, the first dielectric layer 210, and exposed regions of the SOI substrate 106. The second dielectric layer 802 may include for example, silicon dioxide or some other oxide. Further, the second dielectric layer 802 may be formed by, for example, one or more of thermal oxidation, CVD, PVD, or ALD. In some embodiments, the second dielectric layer 802 is formed conformally.

As illustrated by the cross-sectional view 900 of FIG. 9, a third etch is performed into the first and second dielectric layers 210, 802 to expose a second logic device region 304 between first and third logic device regions 302, 306. The process for performing the third etch may comprise, for example, depositing and patterning a third photoresist layer 902 over regions of the second dielectric layer 802 laterally surrounding the second logic device region 304. Further, the process may comprise, for example, applying one or more etchants 904 to the first and second dielectric layers 210, 802 while using the third photoresist layer 902 as a mask. Even more, the process may comprise, for example, subsequently removing or otherwise stripping the third photoresist layer 902.

As illustrated by the cross-sectional view 1000 of FIG. 10, a third dielectric layer 1002 is formed lining the second dielectric layer 802 and the second logic device region 304. The third dielectric layer 1002 may include, for example, silicon dioxide. Further, the third dielectric layer 1002 may be formed by, for example, one or more of thermal oxidation, CVD, PVD, or ALD. In some embodiments, the third dielectric layer 1002 is formed conformally.

Also illustrated by the cross-sectional view 1000 of FIG. 10, a first conductive layer 1004 is formed lining the third dielectric layer 1002. The first conductive layer 1004 may include, for example, polysilicon (e.g., doped polysilicon) or some other conductive material. Further, the first conductive layer 1004 may be formed by, for example, one or more of CVD, PVD, or ALD. In some embodiments, the first conductive layer 1004 is formed conformally.

As illustrated by the cross-sectional view 1100 of FIG. 11, a fourth etch is performed into the charge-trapping layer 130, the first conductive layer 1004 (see, e.g., FIG. 10), and the first, second, and third dielectric layers 210, 802, 1002 (see, e.g., FIG. 10). The fourth etch forms a control gate 118 and a select gate 120 respectively over the control and select transistor regions 502, 504, as well as first, second, and third dummy gates 1102, 1104, 1106 respectively over the first, second, and third logic device regions 302, 304, 306. Further, the fourth etch localizes the charge-trapping layer 130 to under the control gate 118 and localizes the first dielectric layer 210 to under the first dummy gate 1102. Even more, the fourth etch divides the second dielectric layer 802 into multiple second dielectric layers 212, 1108, 1110, 1112 individual to and under the third and first dummy gates 1106, 1102 and the select and control gates 120, 118. Moreover, the fourth etch divides the third dielectric layer 1002 into multiple third dielectric layers 214, 1114, 1116, 1118, 1120 individual to and under the second, third, and first dummy gates 1104, 1106, 1102 and the select and control gates 120, 118.

The process for performing the fourth etch may comprise, for example, depositing and patterning a fourth photoresist layer 1122 over regions of the first conductive layer 1004 corresponding to the control, select, and dummy gates 118, 120, 1102-1106. Further, the process may comprise, for example, applying one or more etchants 1124 to the charge-trapping layer 130, the first conductive layer 1004, and the first, second, and third dielectric layers 210, 802, 1002 while using the fourth photoresist layer 1122 as a mask. Even more, the process may comprise subsequently removing or otherwise stripping the fourth photoresist layer 1124.

Figure 12:
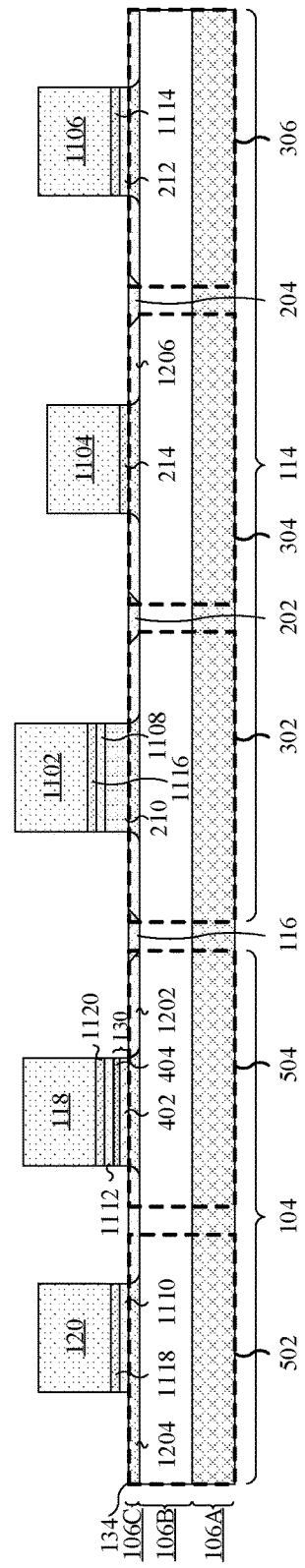

As illustrated by the cross-sectional view 1200 of FIG. 12, lightly-doped drain (LDD) regions 1202, 1204, 1206 are formed in exposed regions of the SOI substrate 106. In some embodiments, the LDD regions 1202, 1204, 1206 are formed by implanting ions 1208 into the SOI substrate 106 by, for example, ion implantation.

Figure 13:
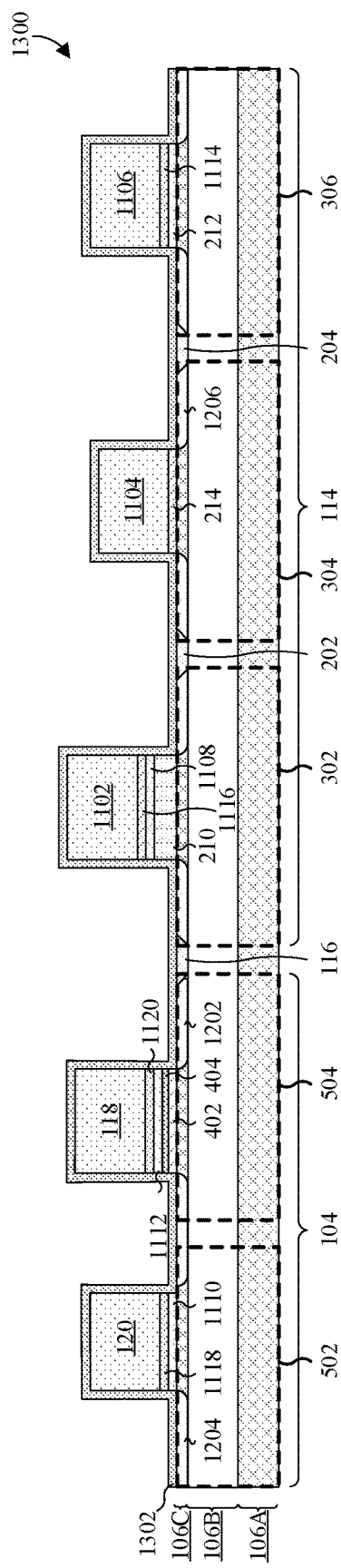

As illustrated by the cross-sectional view 1300 of FIG. 13, a sidewall layer 1302 is formed lining: the first, second, and third dummy gates 1102, 1104, 1106; the control and select 118, 120; and the LDD regions 1202, 1204, 1206. The sidewall layer 1302 may be, for example, silicon dioxide, silicon nitride, or some other dielectric. Further, the sidewall layer 1302 may be formed by, for example, one or more of thermal oxidation, CVD, PVD, or ALD. In some embodiments, the sidewall layer 1302 is formed conformally.

Figure 14:
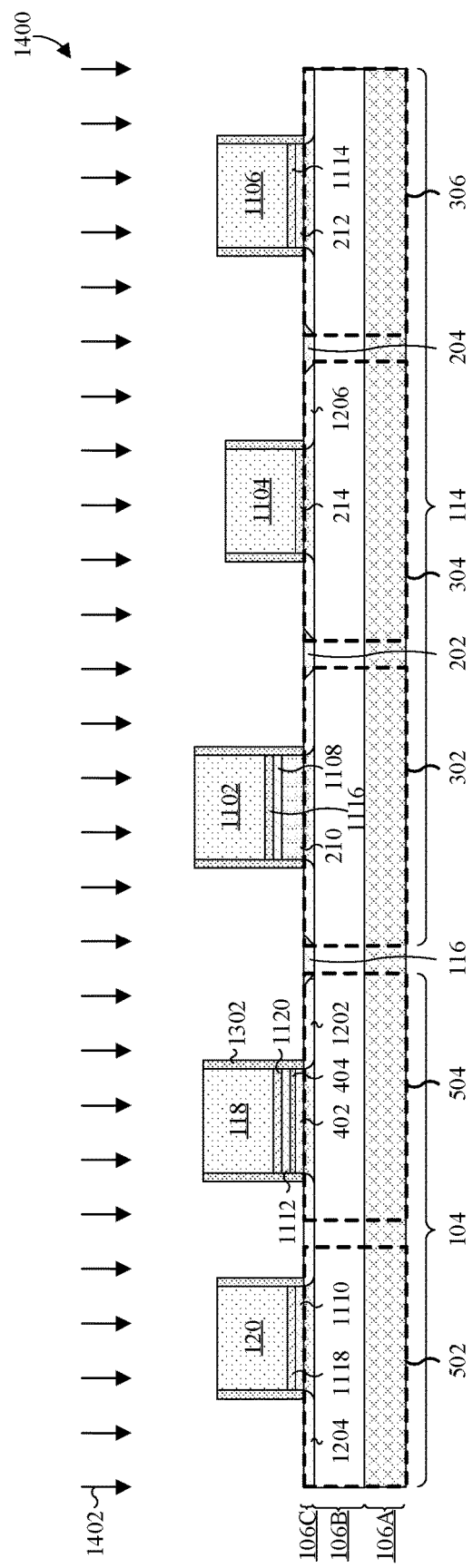

As illustrated by the cross-sectional view 1400 of FIG. 14, the sidewall layer 1302 is etched back to form a main sidewall structure 220 lining sidewalls of the first, second, and third dummy gates 1102, 1104, 1106 and the control and select 118, 120. In some embodiments, the main sidewall structure 220 is confined to sidewalls (i.e., is devoid of lateral extensions). The process for performing the etch back may comprise, for example, applying one or more etchants 1402 to the sidewall layer 1302 for the approximate time it takes the etchant(s) 1402 to etch through a thickness of the sidewall layer 1302.

Figure 15:
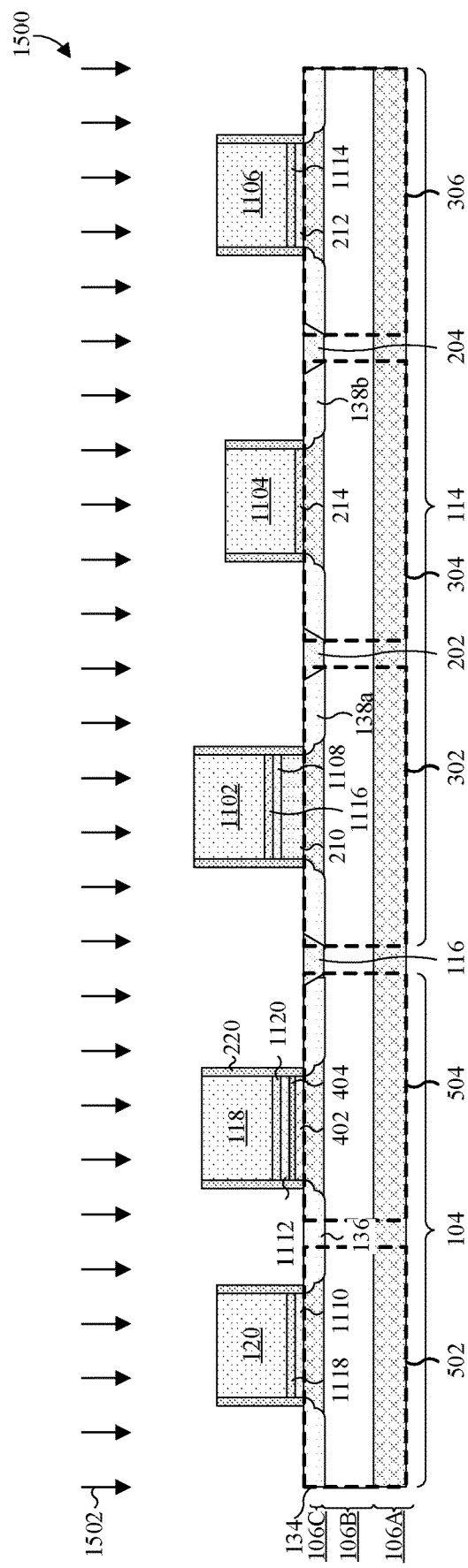

As illustrated by the cross-sectional view 1500 of FIG. 15, source/drain regions 134, 136, 138a, 138b, which include the LDD regions 1202, 1204, 1206 (see, e.g., FIG. 14), are formed. In some embodiments, the source/drain regions 134, 136, 138a, 138b are formed by implanting ions 1502 into the SOI substrate 106 by, for example, ion implantation.

Figure 16:
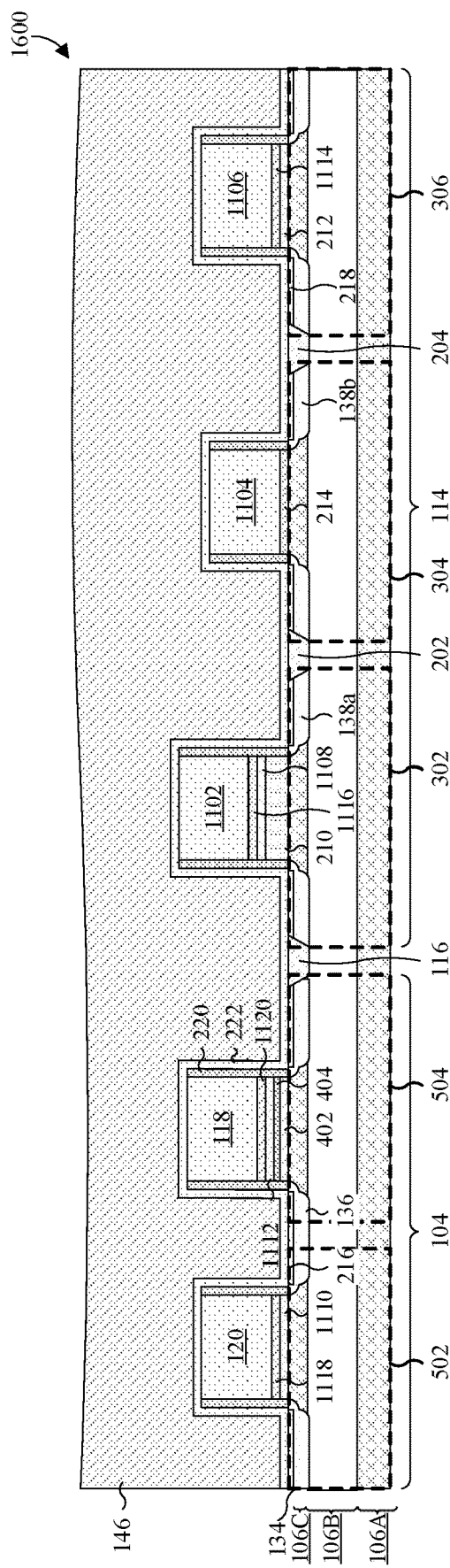

As illustrated by the cross-sectional view 1600 of FIG. 16, in some embodiments, silicide layers 216, 218 are formed on the source/drain regions 134, 136, 138a, 138b. The process for forming the silicide layers 216, 218 may comprise, for example, a nickel silidation process. Further, the process for forming the silicide layers 216, 218 may comprise, for example, forming a resist protect oxide (RPO) layer covering surfaces surrounding the source/drain regions 134, 136, 138a, 138b to block silicide from forming on these surfaces.

Also illustrated by the cross-sectional view 1600 of FIG. 16, a CESL 222 is formed lining: the main sidewall structure 220; upper or top surfaces of the first, second, and third dummy gates 1102, 1104, 1106 and of the control and select gates 118, 120; and the source/drain regions 134, 136, 138a, 138b. The CESL 222 may be, for example, silicon dioxide, silicon nitride, or some other dielectric. Further, the CESL 222 may be formed by, for example, one or more of thermal oxidation, CVD, PVD, or ALD. In some embodiments, the CESL 222 is formed conformally.

Also illustrated by the cross-sectional view 1600 of FIG. 16, a first ILD layer 146 is formed covering the CESL 222. The first ILD layer 146 may be, for example, an oxide, PSG, a low κ dielectric, or some other dielectric. Further, the first ILD layer 146 may be formed by, for example, one or more of CVD or PVD.

As illustrated by the cross-sectional view 1700 of FIG. 17, a first planarization is performed into the first ILD layer 146, the main sidewall structure 220, and the CESL 222 to expose the upper or top surfaces of the first, second, and third dummy gates 1102, 1104, 1106 and of the control and select gates 118, 120. The first planarization may be performed by, for example, a chemical mechanical polish (CMP) and/or an etch back.

As illustrated by the cross-sectional view 1800 of FIG. 18, a fifth etch is performed into the first, second, and third dummy gates 1102, 1104, 1106 (see, e.g., FIG. 17) to remove the dummy gates 1102, 1104, 1106 and to form respective gate openings 1802, 1804. The process for performing the fifth etch may comprise, for example, depositing and patterning a fifth photoresist layer 1806 covering the control and select gates 118, 120. Further, the process may comprise, for example, applying one or more etchants 1808 to the first, second, and third dummy gates 1102, 1104, 1106 while using the fifth photoresist layer 1806 as a mask. Further, the process may comprise, for example, subsequently removing or otherwise stripping the fifth photoresist layer 1806a.

Figure 19:
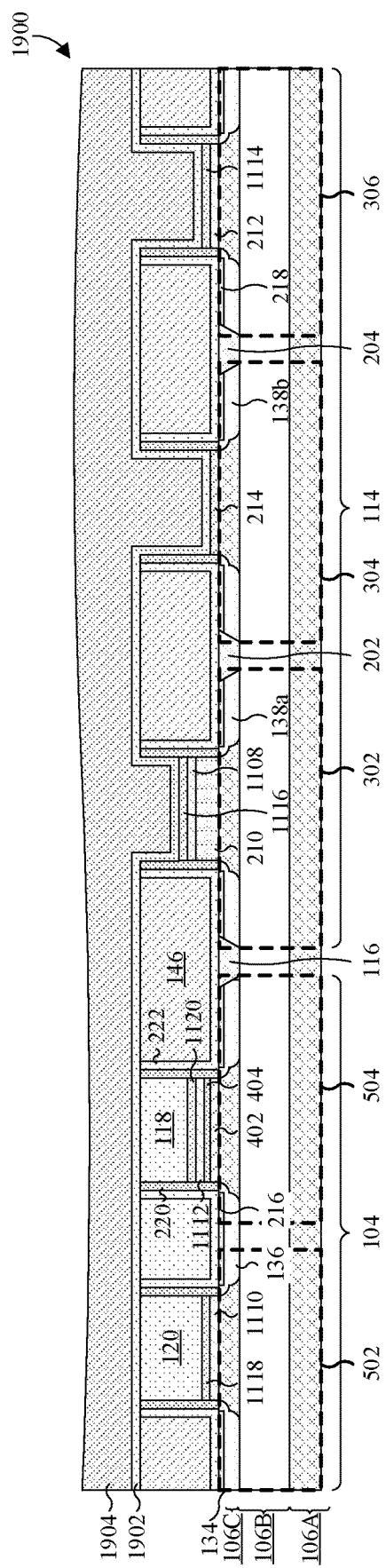

As illustrated by the cross-sectional view 1900 of FIG. 19, a high κ layer 1902 is formed lining the gate openings 1802, 1804 (see, e.g., FIG. 18) previously occupied by the first, second, and third dummy gates 1102, 1104, 1106 (see, e.g., FIG. 17). The high κ layer 1902 has a dielectric constant κ exceeding about 3.9 and may be, for example, hafnium oxide. Further, the high κ layer 1902 may be formed by, for example, CVD, PVD, ALD, or a combination of the foregoing. In some embodiments, the high κ layer 1902 is formed conformally.

Also illustrated by the cross-sectional view 1900 of FIG. 19, a second conductive layer 1904 is formed covering the high κ layer 1902 and in the gate openings 1802, 1804 (see, e.g., FIG. 18). The second conductive layer 1904 is a different material than the first conductive layer 1004 (see, e.g., FIG. 10) and may be, for example, copper, tungsten, aluminum, or some other metal. Further, the second conductive layer 1904 may be formed by, for example, CVD, PVD, ALD, or a combination of the foregoing.

Figure 20:
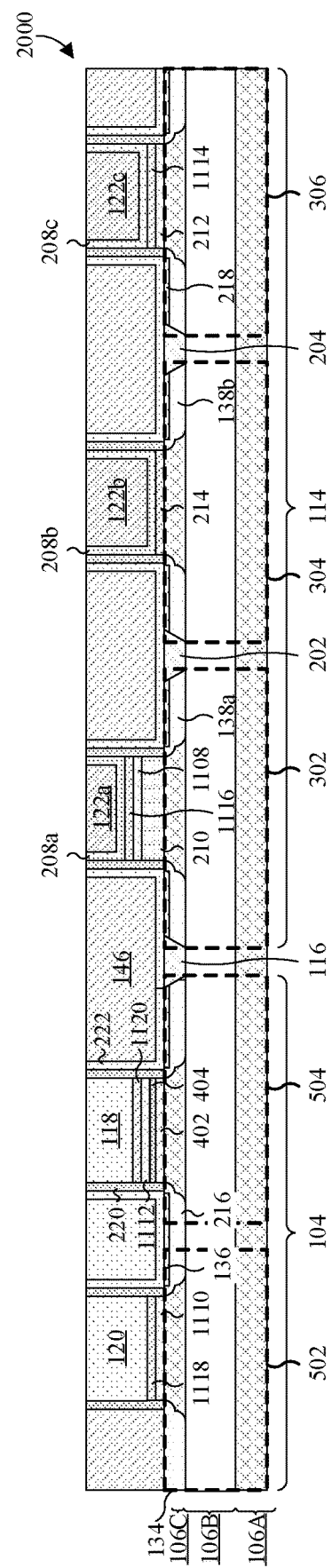

As illustrated by the cross-sectional view 2000 of FIG. 20, a second planarization is performed into the second conductive layer 1904 (see, e.g., FIG. 19) and the high κ layer 1902 (see, e.g., FIG. 19) to about even with upper or top surfaces of the control and select gates 118, 120. The second planarization forms logic gates 122a, 122b, 122c in the gate openings 1802, 1804 (see, e.g., FIG. 18). Further, the second planarization divides the high κ layer 1902 into multiple high κ layer 208a, 208b, 208c individual to and under the logic gates 122a, 122b, 122c. Even more, in some embodiments, the second planarization coplanarizes upper or top surfaces of the logic gates 122a-122c with upper or top surfaces of the first ILD layer 146 and the control gate 118. The second planarization may be performed by, for example, a CMP and/or etch back.

Figure 21:
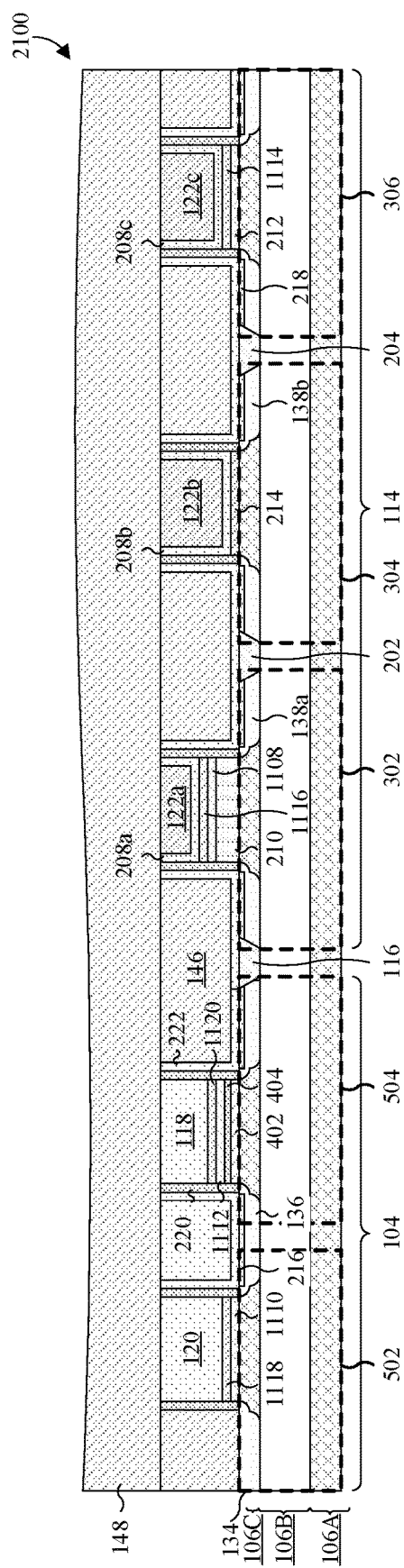

As illustrated by the cross-sectional view 2100 of FIG. 21, a second ILD layer 148 is formed covering the first ILD layer 146, as well as the control and select gates 118, 120 and the logic gates 122a-122c. The second ILD layer 148 may be, for example, an oxide, PSG, or a low κ dielectric. Further, the second ILD layer 148 may be formed by, for example, CVD or PVD.

Figure 22:
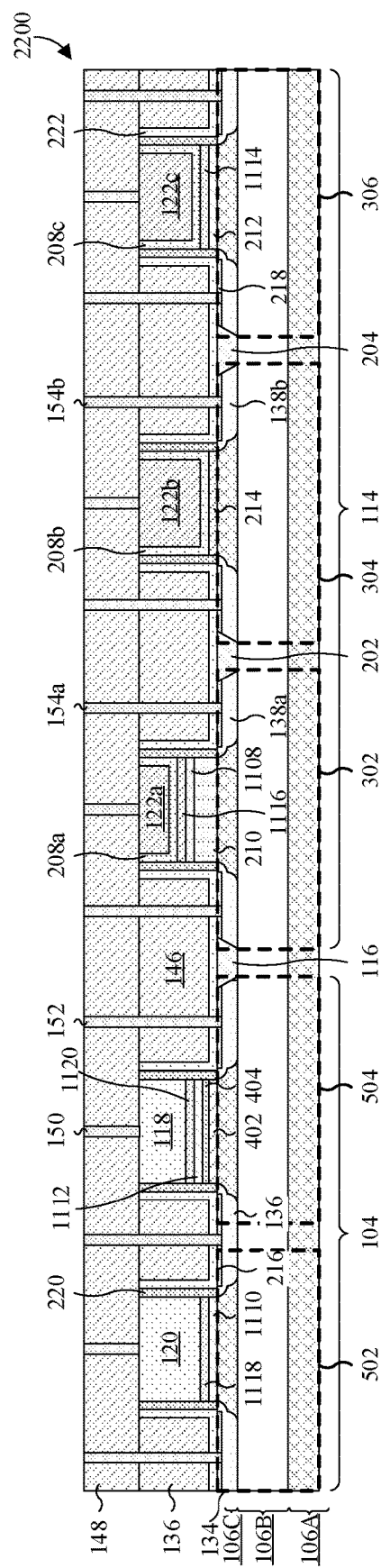

As illustrated by the cross-sectional view 2200 of FIG. 22, a third planarization is performed into the second ILD layer 148. The third planarization may be performed by, for example, a CMP and/or an etch back.

Also illustrated by the cross-sectional view 2200 of FIG. 22, contacts 150, 152, 154a, 154b are formed extending through the first and second ILD layers 146, 148 to the source/drain regions 134, 136, 138a, 138b. Additionally, or alternatively, the contacts 150, 152, 154a, 154b are formed extending to the control, select, and logic gates 118, 120, 122a-122c. The contacts 150, 152, 154a, 154b may be formed of, for example, tungsten, copper, aluminum copper, or some other conductive material. Further, the process for forming the contacts 150, 152, 154a, 154b may comprise, for example, performing a sixth etch into the first and second ILD layers 146, 148 to form contact openings, filling the contact openings with a third conductive layer, and planarizing the third conductive layer to coplanarize upper surfaces of the second ILD layer 148 and the third conductive layer.

Figure 23:
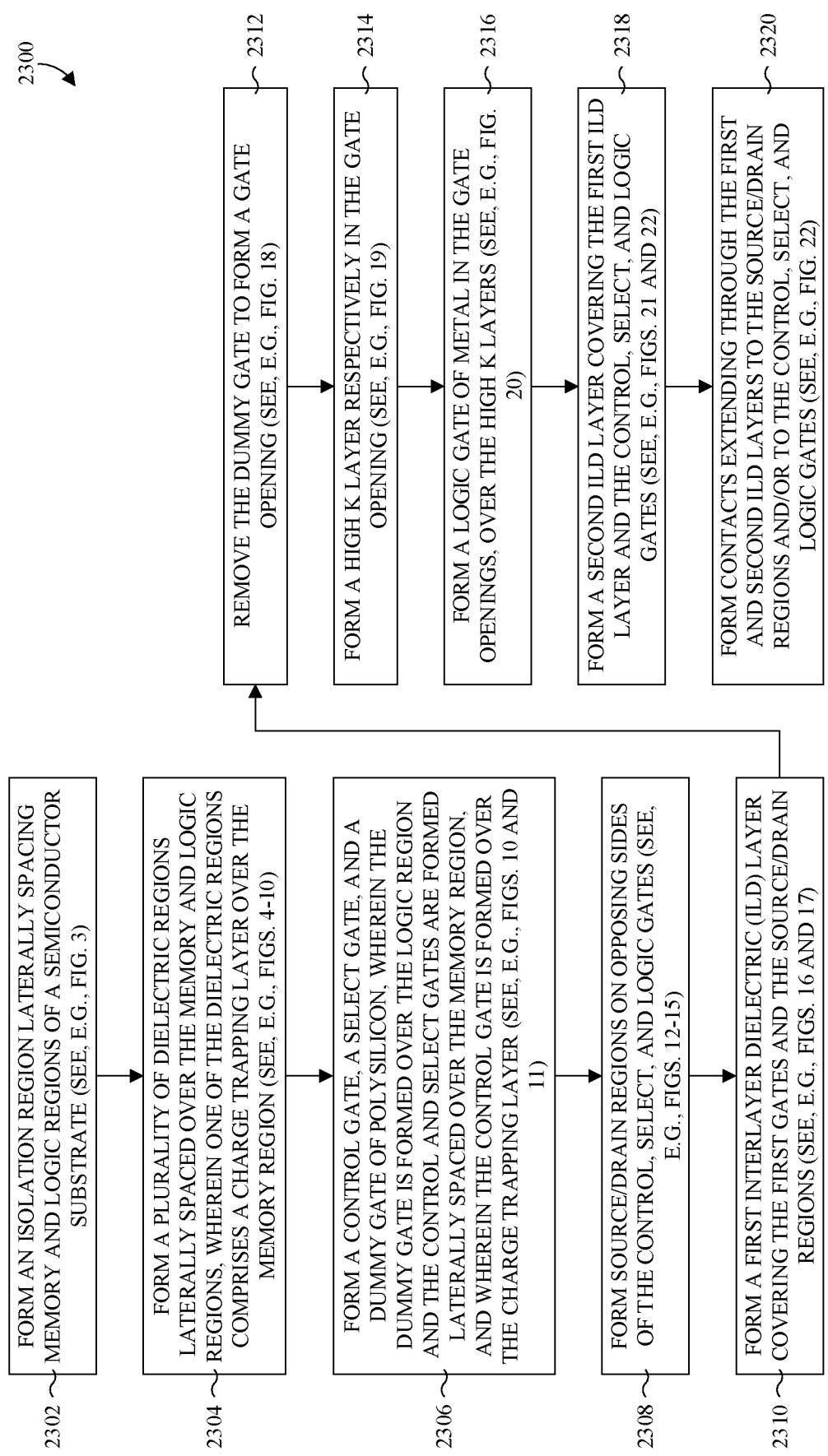
FIG. 23 illustrates a flowchart of some embodiments of the method of FIGS. 3-22.

With reference to FIG. 23, a flowchart 2300 of some embodiments of a high-κ-last method for manufacturing an IC with an embedded SONOS memory cell is provided. The high-κ-last method may, for example, to the series of cross-sectional views illustrated with regard to FIGS. 3-22.

At 2302, an isolation region is formed laterally spacing memory and logic regions of a semiconductor substrate. See, for example, FIG. 3.

At 2304, a plurality of dielectric regions is formed laterally spaced over the memory and logic regions. Further, the plurality of dielectric regions is formed with a dielectric region comprising a charge-trapping layer over the memory region. In some embodiments, the dielectric regions of the plurality are formed with varying thicknesses. See, for example, FIGS. 4-10.

At 2306, a control gate, a select gate, and a dummy gate are formed of polysilicon respectively over the dielectric regions. The dummy gate is formed over the logic region, and the control and select gates are formed laterally spaced over the memory region. Further, the control gate is formed over the charge-trapping layer. See, for example, FIGS. 10 and 11.

At 2308, source/drain regions are formed on opposing sides of the control, select, and dummy gates. See, for example, FIGS. 12-15.

At 2310, a first ILD layer is formed covering the control, select, and dummy gates and the source/drain regions. See, for example, FIGS. 16 and 17.

At 2312, the dummy gate is removed to form a gate opening. See, for example, FIG. 18.

At 2314, a high κ layer is formed in the gate opening. The high κ layer has a dielectric constant κ exceeding about 3.9. See, for example, FIG. 19.

At 2316, a logic gate is formed of metal and in the gate opening, over the high κ layer. See, for example, FIG. 20.

At 2318, a second ILD layer is formed covering the first ILD layer and the control, select, and logic gates. See, for example, FIGS. 21 and 22.

At 2320, contacts are formed extending through the first and second ILD layers to the source/drain regions and/or to the control, select, and logic gates. See, for example, FIG. 22.

While the method is described as using control, select, and dummy gates of polysilicon and a logic gate of metal, different gate materials may be employed. Moreover, while the method is described as using a high κ layer, the high κ layer may be omitted or replaced with a different material. Even more, while the method described by the flowchart 2300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

FIGS. 15A-15D and FIG. 16A collectively illustrate an alternative manufacturing flow used to produce an IC consistent with FIG. 1C. Cross-sectional view 1500A of FIG. 15A corresponds to previously discussed FIG. 15, in which source/drain regions 134, 136, 138a, 138b, have been formed. In some embodiments, the source/drain regions 134, 136, 138a, 138b are formed by implanting ions 1502 into the SOI substrate 106 by, for example, ion implantation.

As illustrated by the cross-sectional view 1500B of FIG. 15B, a fourth photoresist layer can be spun on and patterned to provide a fifth photoresist mask 1550, which has an opening 1552 corresponding to a common source/drain region of the IC. Further, the process may comprise, for example, applying one or more etchants to remove the exposed portion of the semiconductor device layer 106C and underlying insulator layer 106B, thereby forming a recess that extends downward through the semiconductor device layer 106C and underlying insulator layer 106B while the fourth photoresist layer 1122 acts as a mask.

Figure 15C:
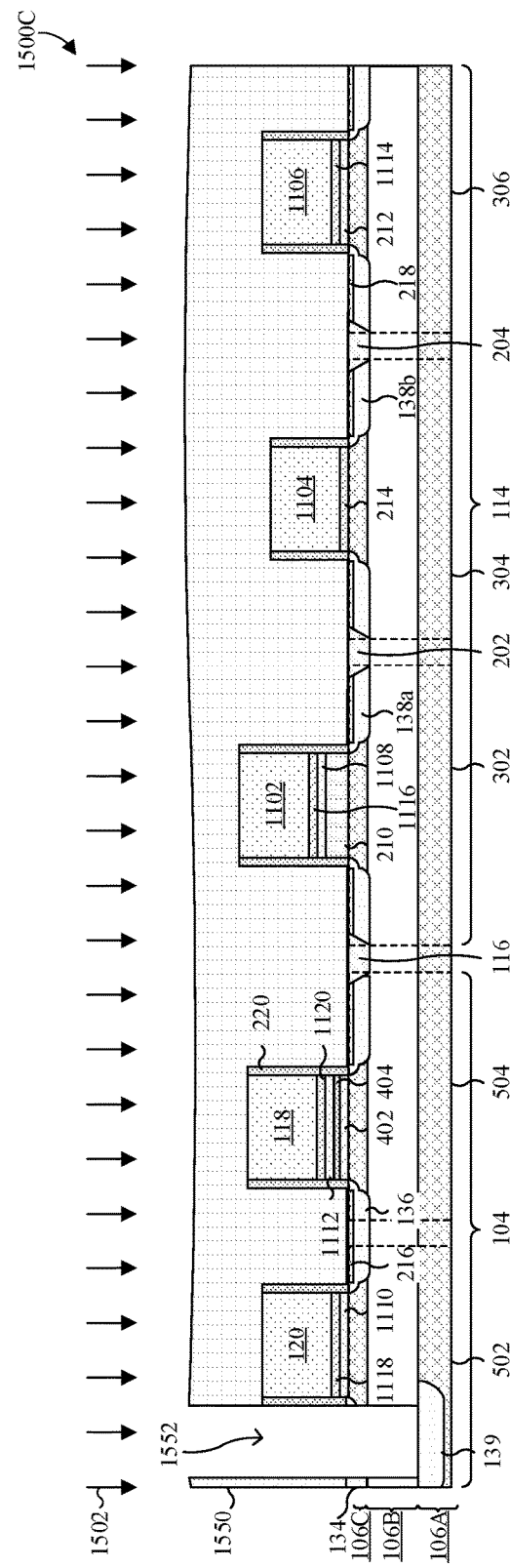

As illustrated by the cross-sectional view 1500C of FIG. 15C, one or more ion implantation operations may be carried out to form a doped region 139 in the handle substrate 106A. After the ion implantation has been carried out, a thermal anneal is performed to diffuse the implanted dopants under the insulator layer 106B and to repair surface damage arising from the ion implantation. Even with the anneal, however, some surface damage, such as dislocations in the lattice may still be present at the upper surface of doped region 139. Because of the diffusion that occurs during the anneal, the doped region 139 typically has a width that is larger than that of the opening 1552.

Figure 15D:
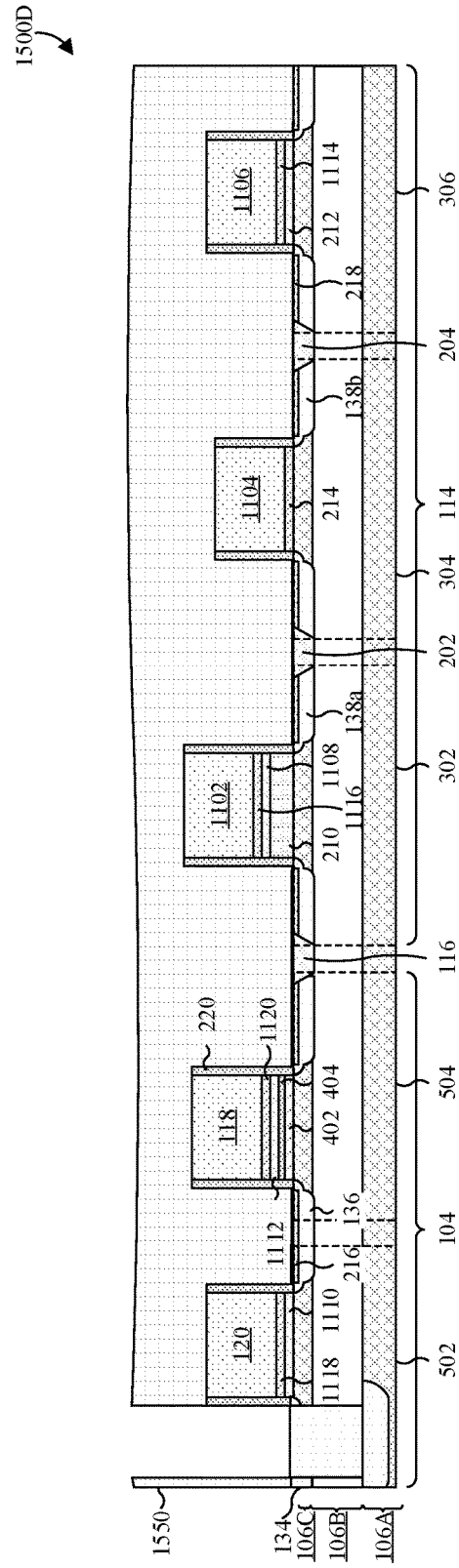

As illustrated by the cross-sectional view 1500D of FIG. 15D, a selective epitaxial growth process may be carried out to grown an epitaxial line 137 over the doped region 139. In some embodiments the epitaxial growth may be stopped so an upper surface of the epitaxial line 137 is substantially planar with the upper surface of the semiconductor device layer 106C, but more typically, the epitaxial line 137 has an uppermost surface that is raised above the upper surface of the semiconductor device layer 106C or remains below the upper surface of the semiconductor device layer 106C. Even more, the process may comprise subsequently removing or otherwise stripping the fifth photoresist mask 1150.

Figure 16A:
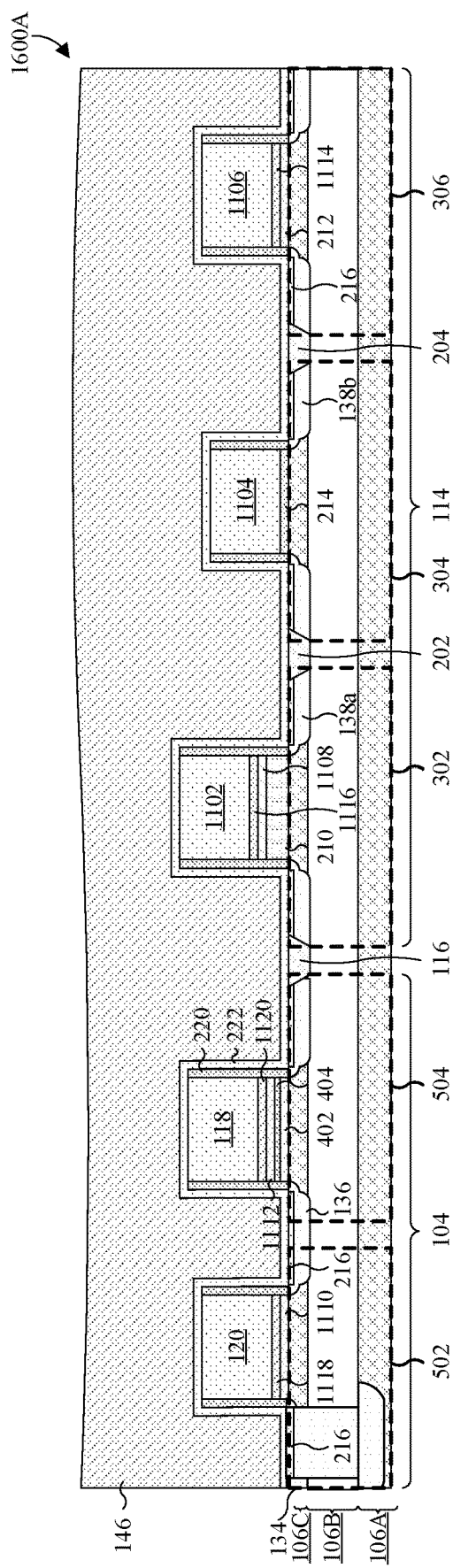

As illustrated by the cross-sectional view 1600A of FIG. 16A, in some embodiments, silicide layers 216 are formed on the source/drain regions 134, 136, 138a, 138b and over the epitaxial line 137. The process for forming the silicide layers 216, 218 may comprise, for example, a nickel silidation process. Further, the process for forming the silicide layers 216, 218 may comprise, for example, forming a resist protect oxide (RPO) layer covering surfaces surrounding the source/drain regions 134, 136, 138a, 138b, and epitaxial line 137 to block silicide from forming on these surfaces.

Also illustrated by the cross-sectional view 1600A of FIG. 16A, a CESL 222 is formed lining: the main sidewall structure 220; upper or top surfaces of the first, second, and third dummy gates 1102, 1104, 1106 and of the control and select gates 118, 120; the source/drain regions 134, 136, 138a, 138b; and epitaxial line 137. The CESL 222 may be, for example, silicon dioxide, silicon nitride, or some other dielectric. Further, the CESL 222 may be formed by, for example, one or more of thermal oxidation, CVD, PVD, or ALD. In some embodiments, the CESL 222 is formed conformally.

Also illustrated by the cross-sectional view 1600A of FIG. 16A, a first ILD layer 146 is formed covering the CESL 222. The first ILD layer 146 may be, for example, an oxide, PSG, a low κ dielectric, or some other dielectric. Further, the first ILD layer 146 may be formed by, for example, one or more of CVD or PVD. After 16A, the alternative method then returns to previously illustrated FIG. 17 and continues through FIG. 22.

Thus, as can be appreciated from above, the present disclosure provides an IC comprising a logic device and a memory cell. The logic device is arranged on a semiconductor substrate and comprises a logic gate arranged within a high κ dielectric layer. The memory cell is arranged on the semiconductor substrate and comprises a control transistor and a select transistor laterally adjacent to one another. The control and select transistors respectively comprise a control gate and a select gate, and the control transistor further comprises a charge-trapping layer underlying the control gate. The control and select gates are a first material, and the logic gate is a second material.

In other embodiments, the present disclosure provides a high-κ-last method for manufacturing an integrated circuit. A charge-trapping layer is formed over a semiconductor substrate. A control gate, a select gate, and a dummy gate are formed of a first material and laterally spaced over the semiconductor substrate. The control gate is formed over the charge-trapping layer. An ILD layer is formed laterally between the control, select, and dummy gates and with an upper surface substantially at a same level with upper surfaces of the control, select, and dummy gates. The dummy gate is removed to form a gate opening. A high κ dielectric layer is formed lining the gate opening. A logic gate of a second material is formed in the gate opening and over the high κ dielectric layer.

In yet other embodiments, the present disclosure provides an IC comprising a logic device and a memory cell. The logic device is arranged on a semiconductor substrate and comprises a logic gate. The memory cell is arranged on the semiconductor substrate and comprises a control transistor and a select transistor laterally adjacent to one another. The control and select transistors respectively comprise a control gate and a select gate, and the control transistor further comprises a charge-trapping layer underlying the control gate. The control and select gates are a first material, and the logic gate is a second material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a semiconductor-on-insulator (SOI) substrate comprising a handle substrate, an insulator layer over the handle substrate, and a semiconductor device layer over the insulator layer;
a logic device comprising a logic gate arranged over the semiconductor device layer; and
a memory cell comprising a control gate and a select gate laterally adjacent to one another and arranged over the semiconductor device layer, wherein a charge-trapping layer underlies the control gate, the memory cell further comprising a doped region arranged in the handle substrate and an epitaxial semiconductor region extending from near an upper surface of the semiconductor device layer to an upper surface of the doped region.

2. The IC according to claim 1, wherein the SOI substrate is a fully depleted SOI (FDSOI) substrate.

3. The IC according to claim 1, wherein the semiconductor device layer is a monocrystalline silicon layer having a thickness ranging from 5 nm to 40 nm, and the insulator layer is a silicon dioxide or sapphire layer having a thickness ranging from 10 nm to 60 nm.

4. The IC according to claim 1, wherein the semiconductor device layer has a thickness such that during operation of the memory cell or the logic device, a depletion region in a channel region of the memory cell or the logic device extends fully across the thickness of the semiconductor device layer.

5. The IC according to claim 1, further comprising:
an individual source/drain region disposed to a first side of the control gate;
an intermediate source/drain region arranged laterally between a second side of the control gate and a first side of the select gate, the second side of the control gate being opposite the first side of the select gate.

6. The IC according to claim 5, wherein the doped region is a common source/drain region arranged on to a second side of the select gate opposite the first side, wherein the common source/drain region has a lowermost portion that extends into the handle substrate.

7. The IC according to claim 6, wherein the control gate extends in a first direction and the common source/drain region extends continuously between multiple memory cells in a second direction perpendicular to the first direction, and the common source/drain region is coupled to respective source/drain regions of the multiple memory cells.

8. The IC according to claim 5, wherein the individual source/drain region and the intermediate source/drain region have lower portions in direct contact with an upper surface of the insulator layer of the SOI substrate.

9. The IC according to claim 8, further comprising:
an isolation region arranged in the semiconductor device layer between the memory cell and the logic device, the isolation region extending from an upper surface of the semiconductor device layer and contacting the upper surface of the insulator layer.

10. The IC of claim 1, wherein the doped region has an outer edge arranged directly under the select gate.

11. The IC of claim 1, wherein the doped region has a first width as measured in a first direction parallel to an upper surface of the handle substrate, and wherein the epitaxial semiconductor region has a second width as measured in the first direction, the second width being less than the first width.

12. An integrated circuit (IC) including a memory device, comprising:
a semiconductor-on-insulator (SOI) substrate comprising a handle substrate, an insulator layer over the handle substrate, and a semiconductor device layer over the insulator layer;
first and second individual source/drain regions arranged in the semiconductor device layer and spaced apart from one another in a first direction;
first and second intermediate source/drain regions arranged in the semiconductor device layer and arranged between the first and second individual source/drain regions, the first individual source/drain region being spaced apart from the first intermediate source/drain region by a first control channel region, and the second individual source/drain region being spaced apart from the second intermediate source/drain region by a second control channel region;
a common source/drain region arranged in the semiconductor device layer and arranged between the first and second intermediate source/drain regions, the first intermediate source/drain region being spaced apart from the common source/drain region by a first select channel region, and the second intermediate source/drain region being spaced apart from the common source/drain region by a second select channel region;
first and second control gates arranged over the first and second control channel regions, respectively;
first and second select gates arranged over the first and second select channel regions, respectively, the first and second select gates extending continuously in a second direction perpendicular to the first direction to extend over multiple columns of memory cells for the memory device; and
wherein the common source/drain region extends continuously in the second direction to be coupled to respective source/drain regions of the multiple columns of memory cells for the memory device;
wherein the common source/drain region includes a doped region arranged in the handle substrate and an epitaxial semiconductor region extending from near an upper surface of the semiconductor device layer to an upper surface of the doped region.

13. The IC of claim 12, wherein the common source/drain region has outermost edges that are arranged directly under the first and second select gates.

14. The IC of claim 12, wherein the doped region has a first width as measured in the first direction between nearest edges of the first and second select gates, and wherein the epitaxial semiconductor region has a second width as measured in the first direction, the second width being less than the first width.

15. An integrated circuit (IC) including a memory device comprising:
a semiconductor-on-insulator (SOI) substrate comprising a handle substrate, an insulator layer over the handle substrate, and a semiconductor device layer over the insulator layer;

a memory cell comprising a control gate and a select gate laterally adjacent to one another and arranged over the semiconductor device layer, wherein a charge-trapping layer underlies the control gate; and a common source/drain region arranged in the SOI substrate to a side of the select gate, the common source/drain region having an upper surface that corresponds to an upper surface of the semiconductor device layer and that is below a lower surface of the control gate, and having a lowermost surface below an upper surface of the handle substrate;

wherein the common source/drain region includes a doped region arranged in the handle substrate and an epitaxial semiconductor region extending from near an upper surface of the semiconductor device layer to an upper surface of the doped region.

16. The IC of claim 15, wherein the common source/drain region extends in a continuous path between multiple common source/drain regions of multiple respective columns of the memory device.

17. The IC of claim 15, wherein the common source/drain region has an outer edge arranged directly under the select gate.

18. The IC of claim 15, further comprising:

a logic device comprising a logic gate arranged over the semiconductor device layer;

wherein the logic gate is spaced apart from a logic channel region within the semiconductor device layer by a high κ dielectric layer.

19. The IC according to claim 15, further comprising:

an intermediate source/drain region disposed in the semiconductor device layer between the select gate and the control gate; and an individual source/drain region disposed in the semiconductor device layer to a side of the control gate opposite the intermediate source/drain region.

20. The IC according to claim 19, further comprising:

bias circuitry configured to carry out a program-inhibit operation by biasing the common source/drain region to approximately −3.5 volts, while the individual source/drain region is biased to less than +1.1 volts, while the select gate is biased to approximately −3.5 volts, and while the control gate is biased to approximately +4 volts.

* * * * *